(12) United States Patent
Ichiryu et al.

(10) Patent No.: US 11,257,733 B2
(45) Date of Patent: Feb. 22, 2022

(54) SEMICONDUCTOR DEVICE INCLUDING HEAT-DISSIPATING METAL MULTILAYER HAVING DIFFERENT THERMAL CONDUCTIVITY, AND METHOD FOR MANUFACTURING SAME

(71) Applicant: PANASONIC INTELLECTUAL PROPERTY MANAGEMENT CO., LTD., Osaka (JP)

(72) Inventors: Takashi Ichiryu, Osaka (JP); Masanori Nomura, Osaka (JP); Yusuke Kinoshita, Kyoto (JP); Hidetoshi Ishida, Osaka (JP); Yasuhiro Yamada, Tokyo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 215 days.

(21) Appl. No.: 16/497,744

(22) PCT Filed: Mar. 27, 2018

(86) PCT No.: PCT/JP2018/012278
§ 371 (c)(1),
(2) Date: Sep. 25, 2019

(87) PCT Pub. No.: WO2018/181236
PCT Pub. Date: Oct. 4, 2018

(65) Prior Publication Data
US 2020/0027814 A1    Jan. 23, 2020

(30) Foreign Application Priority Data
Mar. 31, 2017    (JP) .............................. JP2017-072702

(51) Int. Cl.
*H01L 23/367*    (2006.01)
*H01L 23/29*    (2006.01)
(Continued)

(52) U.S. Cl.
CPC ............ *H01L 23/367* (2013.01); *H01L 23/29* (2013.01); *H01L 23/31* (2013.01);
(Continued)

(58) Field of Classification Search
CPC ....... H01L 23/367; H01L 23/29; H01L 23/31; H01L 23/3735; H01L 23/5329; H01L 24/02
See application file for complete search history.

(56) References Cited

U.S. PATENT DOCUMENTS

2001/0028110 A1   10/2001   Andoh
2002/0127769 A1   9/2002   Ma et al.
(Continued)

FOREIGN PATENT DOCUMENTS

JP    2001-291793    10/2001
JP    2007-116198 A    5/2007
(Continued)

OTHER PUBLICATIONS

International Search Report and Written Opinion issued in International Patent Application No. PCT/JP2018/012278, dated Jun. 12, 2018; with partial English translation.

*Primary Examiner* — Matthew E. Gordon
(74) *Attorney, Agent, or Firm* — McDermott Will and Emery LLP

(57) ABSTRACT

A semiconductor device includes a supporting substrate, a semiconductor chip, a resin member, and a heat-dissipating metal layer. The supporting substrate has a first surface and a second surface located opposite from each other in a thickness direction defined for the supporting substrate. The (Continued)

semiconductor chip includes a plurality of electrodes. The semiconductor chip is bonded to the supporting substrate on one side thereof with the first surface. The resin member has a first surface and a second surface located opposite from each other in a thickness direction defined for the resin member. The resin member covers at least a side surface of the supporting substrate and a side surface of the semiconductor chip. The heat-dissipating metal layer is arranged in contact with the supporting substrate and the resin member to cover the second surface of the supporting substrate and the second surface of the resin member at least partially.

18 Claims, 16 Drawing Sheets

(51) Int. Cl.
  *H01L 23/31* (2006.01)
  *H01L 23/373* (2006.01)
  *H01L 23/532* (2006.01)
  *H01L 23/00* (2006.01)

(52) U.S. Cl.
  CPC ...... *H01L 23/3735* (2013.01); *H01L 23/5329* (2013.01); *H01L 24/02* (2013.01); *H01L 2924/1304* (2013.01)

(56) References Cited

U.S. PATENT DOCUMENTS

| 2004/0009630 | A1 | 1/2004 | Andoh |
| 2011/0018114 | A1* | 1/2011 | Pagaila ............... H01L 21/568 257/686 |
| 2013/0048350 | A1 | 2/2013 | Horiuchi et al. |
| 2015/0282379 | A1* | 10/2015 | Terasaki ............... H05K 7/209 361/720 |
| 2016/0172335 | A1 | 6/2016 | Sato |

FOREIGN PATENT DOCUMENTS

| JP | 2013-046036 A | 3/2013 |
| JP | 2016-115727 A | 6/2016 |

* cited by examiner

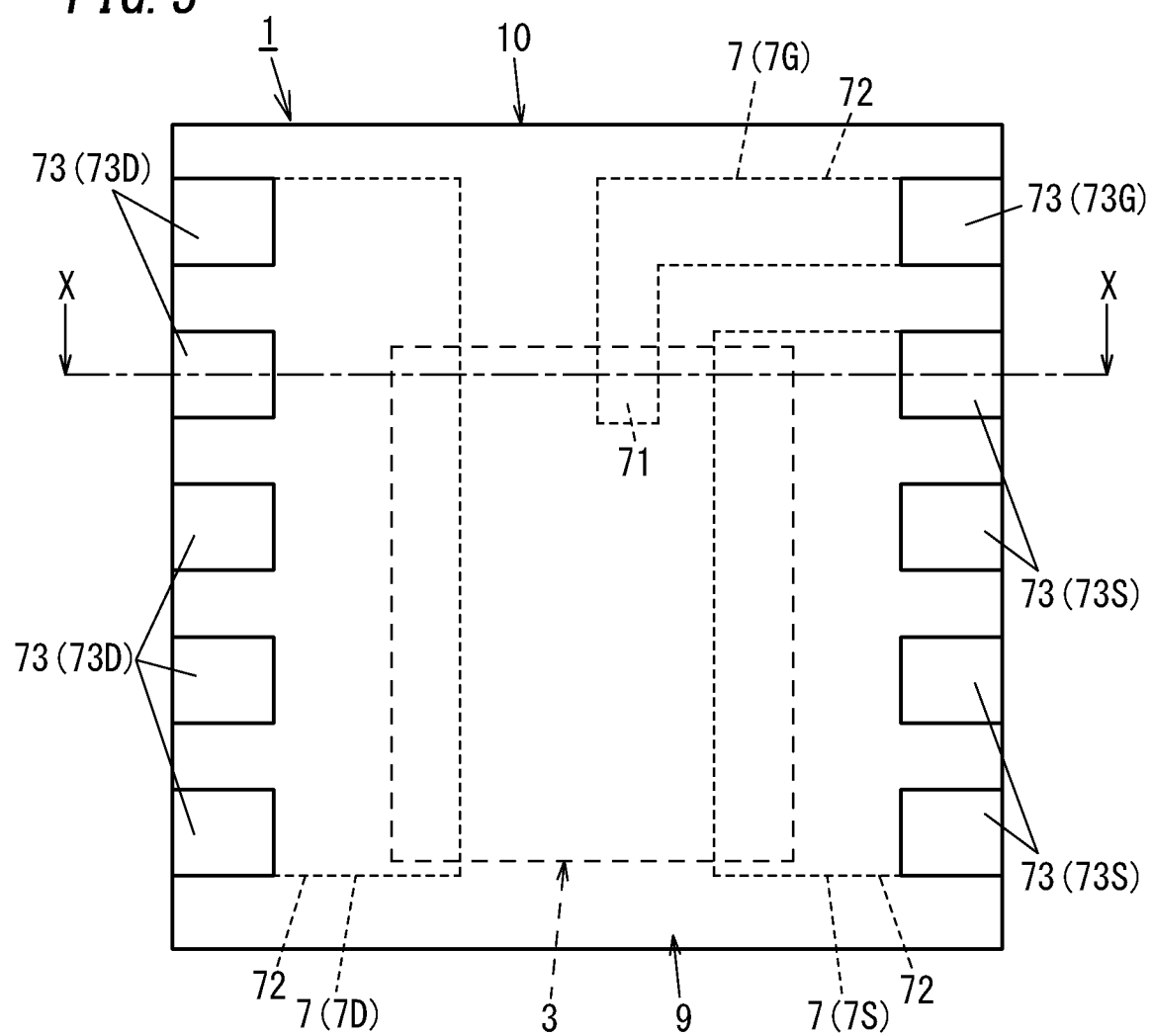

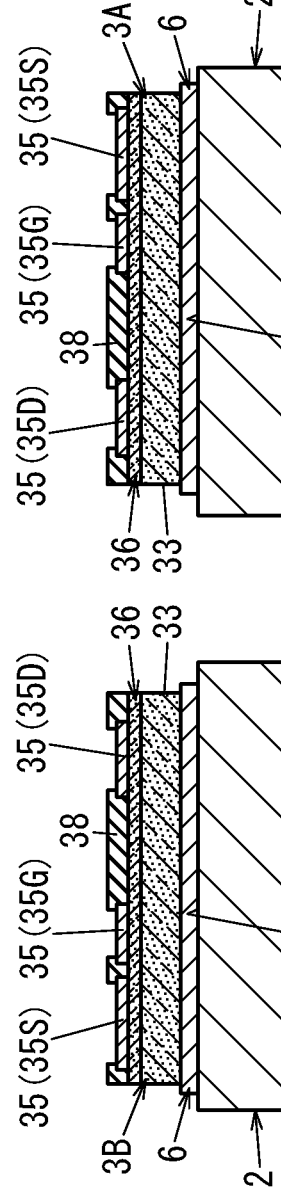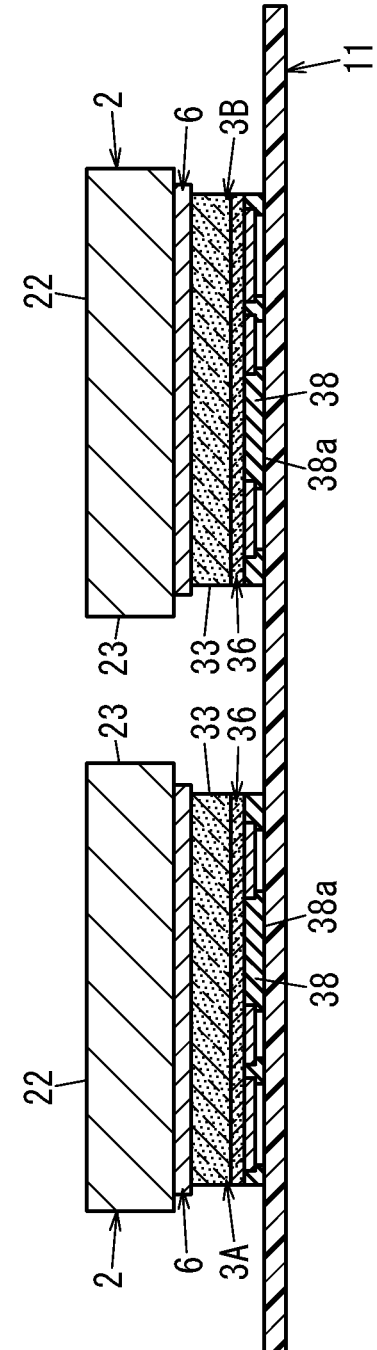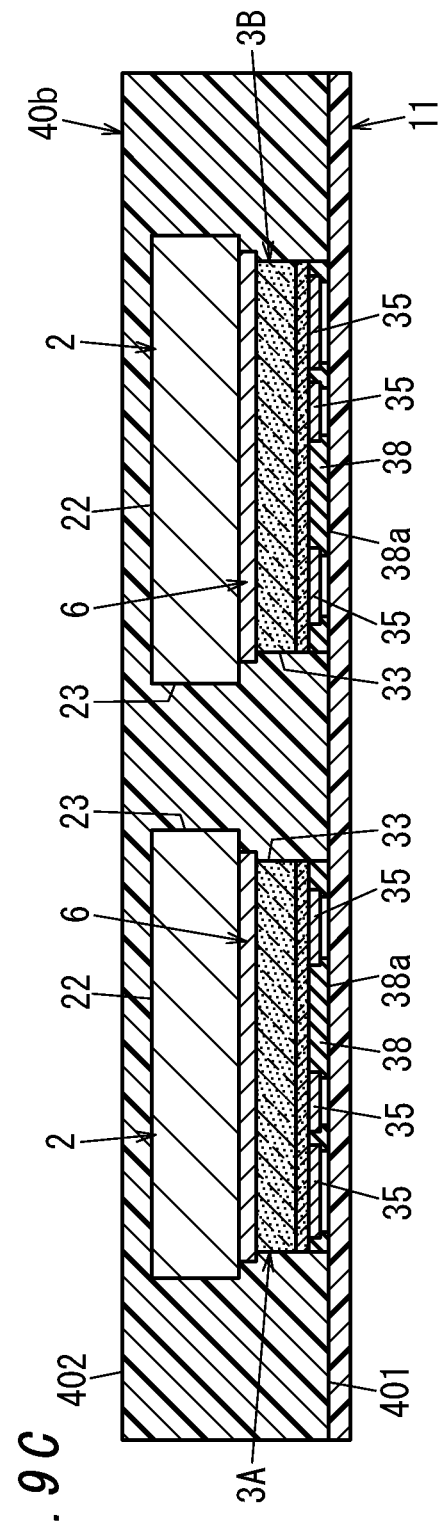

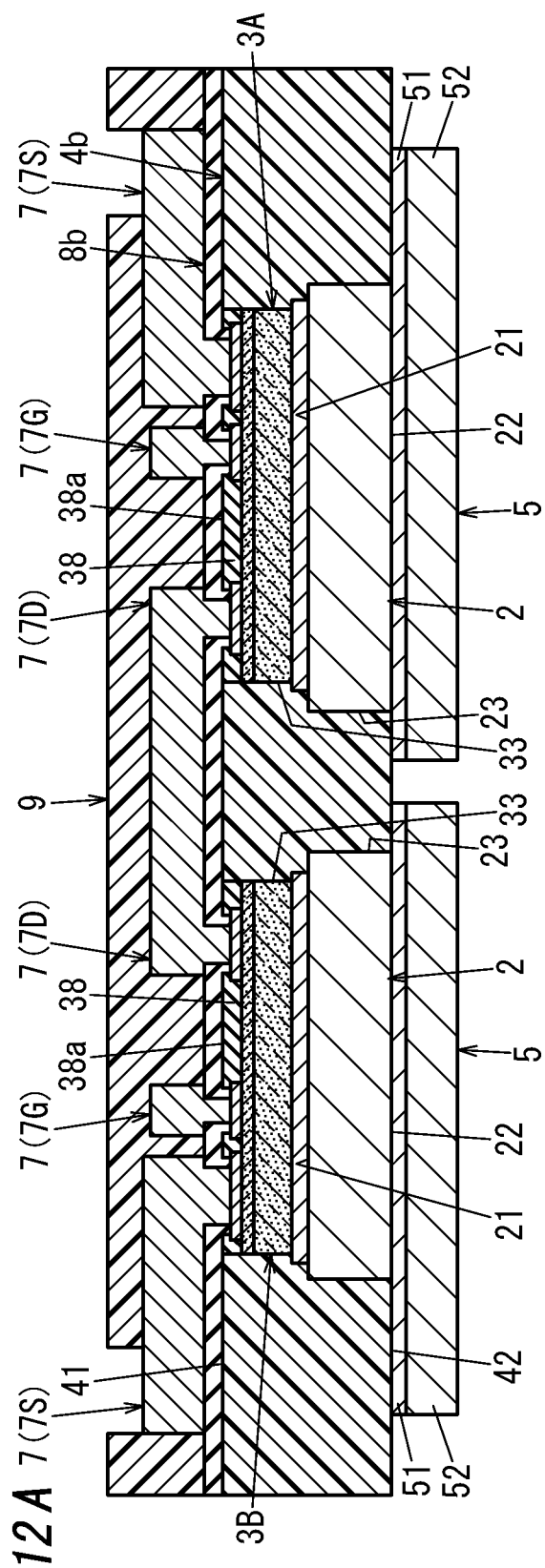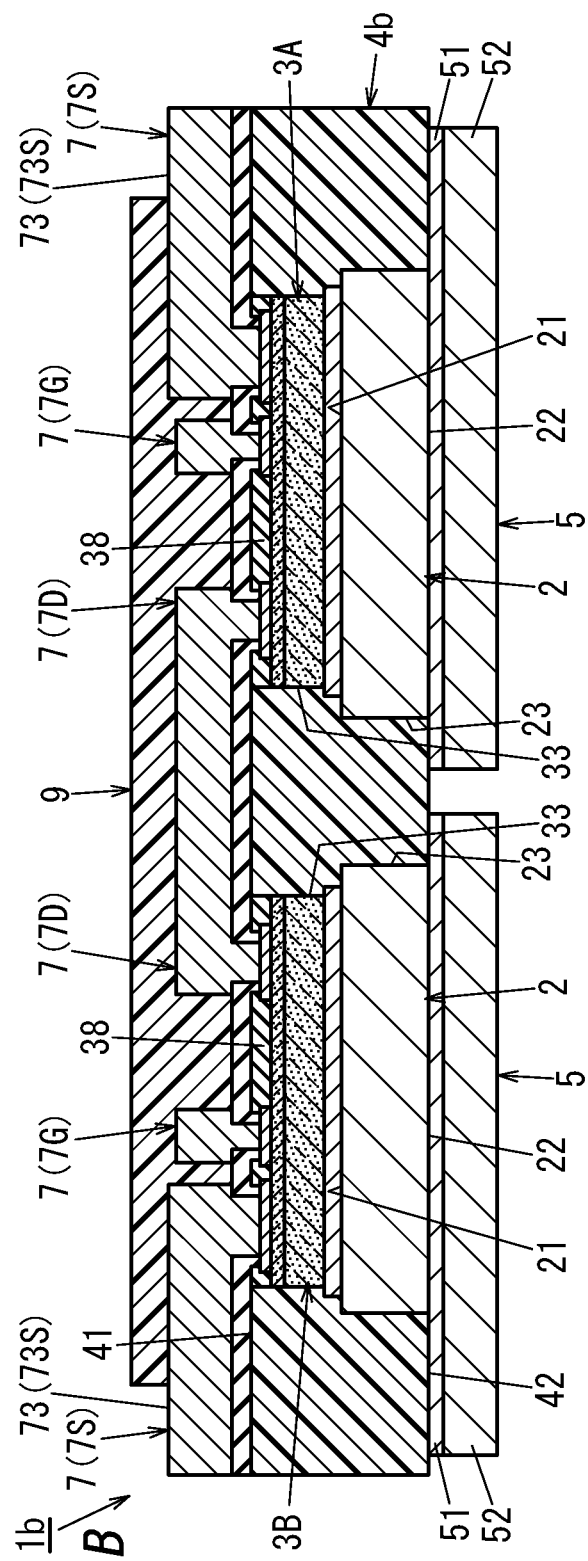

SEMICONDUCTOR DEVICE INCLUDING HEAT-DISSIPATING METAL MULTILAYER HAVING DIFFERENT THERMAL CONDUCTIVITY, AND METHOD FOR MANUFACTURING SAME

CROSS-REFERENCE OF RELATED APPLICATIONS

This application is the U.S. National Phase under 35 U.S.C. § 371 of International Patent Application No. PCT/JP2018/012278, filed on Mar. 27, 2018, which in turn claims the benefit of Japanese Application No. 2017-072702, filed on Mar. 31, 2017, the entire disclosures of which Applications are incorporated by reference herein.

TECHNICAL FIELD

The present invention generally relates to a semiconductor device and a method for fabricating the same, and more particularly relates to a semiconductor device including a semiconductor chip and a method for fabricating such a semiconductor device.

BACKGROUND ART

A semiconductor device including a power semiconductor device has been known as a type of semiconductor device in the art (see, for example, Patent Literature 1).

The semiconductor device of Patent Literature 1 includes a supporting member (die pad), a first semiconductor chip, a second semiconductor chip, a group of lead terminals, a group of bonding wires, and an encapsulating member. The first semiconductor chip includes a power semiconductor device including a field effect transistor. The second semiconductor chip includes a controller for controlling the power semiconductor device. In this semiconductor device, the second semiconductor chip is secured with an adhesive onto the die pad, and the first semiconductor chip is secured with an adhesive to the second semiconductor chip. The encapsulating member encapsulates the die pad, the second semiconductor chip, the first semiconductor chip, the group of lead terminals, and the group of bonding wires together.

There has been an increasing demand for improving the heat dissipation properties of semiconductor devices, while reducing the overall size thereof.

CITATION LIST

Patent Literature

Patent Literature 1: JP 2016-115727 A

SUMMARY OF INVENTION

It is therefore an object of the present invention to provide a semiconductor device with not only a reduced overall size but also improved heat dissipation properties and also provide a method for fabricating such a semiconductor device.

Solution to Problem

A semiconductor device according to a first aspect of the present invention includes a supporting substrate, a semiconductor chip, a resin member, and a heat-dissipating metal layer. The supporting substrate has a first surface and a second surface that are located opposite from each other in a thickness direction defined for the supporting substrate. The semiconductor chip includes a plurality of electrodes. The semiconductor chip is bonded to the supporting substrate on one side thereof with the first surface. The resin member has a first surface and a second surface that are located opposite from each other in a thickness direction defined for the resin member. The resin member covers at least a side surface of the supporting substrate and a side surface of the semiconductor chip. The heat-dissipating metal layer is arranged in contact with the supporting substrate and the resin member to cover the second surface of the supporting substrate and the second surface of the resin member at least partially.

In a semiconductor device according to a second aspect of the present invention, which may be implemented in conjunction with the first aspect, the heat-dissipating metal layer includes a first metal layer and a second metal layer. The first metal layer is arranged in contact with the second surface of the supporting substrate and the second surface of the resin member. The second metal layer is arranged opposite from the supporting substrate and the resin member with respect to the first metal layer and has a greater thickness, and a higher thermal conductivity, than the first metal layer.

In a semiconductor device according to a third aspect of the present invention, which may be implemented in conjunction with the second aspect, metallic grains of the first metal layer have a smaller average grain size than metallic grains of the second metal layer.

In a semiconductor device according to a fourth aspect of the present invention, which may be implemented in conjunction with any one of the first to third aspects, the semiconductor chip includes a substrate, a semiconductor layer, the plurality of electrodes, and an electrical insulating layer. The substrate has a principal surface and a back surface that are located opposite from each other in a thickness direction defined for the substrate. The semiconductor layer is arranged on the principal surface of the substrate. The plurality of electrodes are arranged on one surface, opposite from the substrate, of the semiconductor layer. The electrical insulating layer is arranged on the surface of the semiconductor layer. The electrical insulating layer has a plurality of holes that respectively expose the plurality of electrodes. The semiconductor device further includes a plurality of conductor layers. The plurality of conductor layers are formed along respective surfaces of the plurality of electrodes of the semiconductor chip, a surface of the electrical insulating layer of the semiconductor chip, and the first surface of the resin member.

In a semiconductor device according to a fifth aspect of the present invention, which may be implemented in conjunction with the fourth aspect, each of the plurality of conductor layers includes a first interconnect layer and a second interconnect layer. The first interconnect layer is arranged in contact with an associated one of the plurality of electrodes and located inside of a corresponding one of the plurality of holes. The second interconnect layer is formed along the surface of the electrical insulating layer and the first surface of the resin member.

In a semiconductor device according to a sixth aspect of the present invention, which may be implemented in conjunction with the fifth aspect, at least one conductor layer, out of the plurality of conductor layers, includes a terminal layer arranged opposite from the first interconnect layer with respect to the second interconnect layer. The terminal layer is formed along the first surface of the resin member.

In a semiconductor device according to a seventh aspect of the present invention, which may be implemented in conjunction with the sixth aspect, the electrical insulating layer is an organic film. The semiconductor device further includes, besides a first electrical insulating layer serving as the electrical insulating layer, a second electrical insulating layer. The second electrical insulating layer covers at least a part of the surface of the first electrical insulating layer and at least a part of the first surface of the resin member. The second electrical insulating layer covers a boundary between the surface of the first electrical insulating layer and the first surface of the resin member. The second interconnect layer and the terminal layer are formed on the second electrical insulating layer.

A semiconductor device according to an eighth aspect of the present invention, which may be implemented in conjunction with the seventh aspect, further includes, besides a first heat-dissipating metal layer serving as the heat-dissipating metal layer, a second heat-dissipating metal layer. The second heat-dissipating metal layer is formed on the second electrical insulating layer so as to overlap with a part of the semiconductor chip in a thickness direction defined for the semiconductor chip and is out of contact with the plurality of conductor layers.

In a semiconductor device according to a ninth aspect of the present invention, which may be implemented in conjunction with the eighth aspect, the second electrical insulating layer has a through hole, in which a portion of the second heat-dissipating metal layer is arranged. The second heat-dissipating metal layer is formed over the surface of the first electrical insulating layer and a surface of the second electrical insulating layer.

In a semiconductor device according to a tenth aspect of the present invention, which may be implemented in conjunction with any one of the first to ninth aspects, the semiconductor chip includes a transistor.

In a semiconductor device according to an eleventh aspect of the present invention, which may be implemented in conjunction with the tenth aspect, the semiconductor chip includes a substrate and the transistor. The substrate has a principal surface and a back surface that are located opposite from each other in a thickness direction defined for the substrate. The transistor is a lateral transistor including: a semiconductor layer arranged on the principal surface of the substrate; and the plurality of electrodes arranged on one surface, opposite from the substrate, of the semiconductor layer.

A method for fabricating a semiconductor device according to a twelfth aspect of the present invention is designed to fabricate the semiconductor device according to any one of the first to eleventh aspects. The method includes: forming, by plating, a metal layer as a prototype of the heat-dissipating metal layer in contact with the second surface of the supporting substrate and the second surface of the resin member; and then patterning the metal layer to form the heat-dissipating metal layer out of a part of the metal layer.

A method for fabricating a semiconductor device according to a thirteenth aspect of the present invention is designed to fabricate the semiconductor device according to the second or third aspect. The method includes: forming, by dry plating, a first metal film as a prototype of the first metal layer in contact with the second surface of the supporting substrate and the second surface of the resin member; forming, by wet plating, a second metal film as a prototype of the second metal layer on the first metal film after having formed the first metal film such that the second metal film is arranged opposite from the supporting substrate and the resin member with respect to the first metal film; and then patterning a metal layer as a multilayer stack including the first metal film and the second metal film to form the heat-dissipating metal layer out of a part of the metal layer.

A method for fabricating a semiconductor device according to a fourteenth aspect of the present invention is designed to fabricate the semiconductor device according to the fourth aspect. The method includes: bonding the semiconductor chip and the supporting substrate together; forming, after having bonded the semiconductor chip and the supporting substrate, a resin layer as a prototype of the resin member so as to cover the side surface of the supporting substrate, the side surface of the semiconductor chip, and the second surface of the supporting substrate; polishing, after having formed the resin layer, the resin layer to the point of exposing the second surface of the supporting substrate to form the resin member out of a part of the resin layer; and then forming, by plating, the heat-dissipating metal layer and the plurality of conductor layers.

BRIEF DESCRIPTION OF DRAWINGS

FIG. 3 is a bottom view of the semiconductor device;

FIGS. 9A-9C are cross-sectional views illustrating main process steps of a method for fabricating the semiconductor device;

FIGS. 12A and 12B are cross-sectional views illustrating main process steps of the method for fabricating the semiconductor device;

DESCRIPTION OF EMBODIMENTS

Note that FIGS. 1-16 to be referred to in the following description of the exemplary embodiment are just schematic representations, in which the dimensions and thicknesses of respective constituent elements and their ratios are not always to scale, compared with their actual dimensional ratios.

Embodiment

Figure 1:
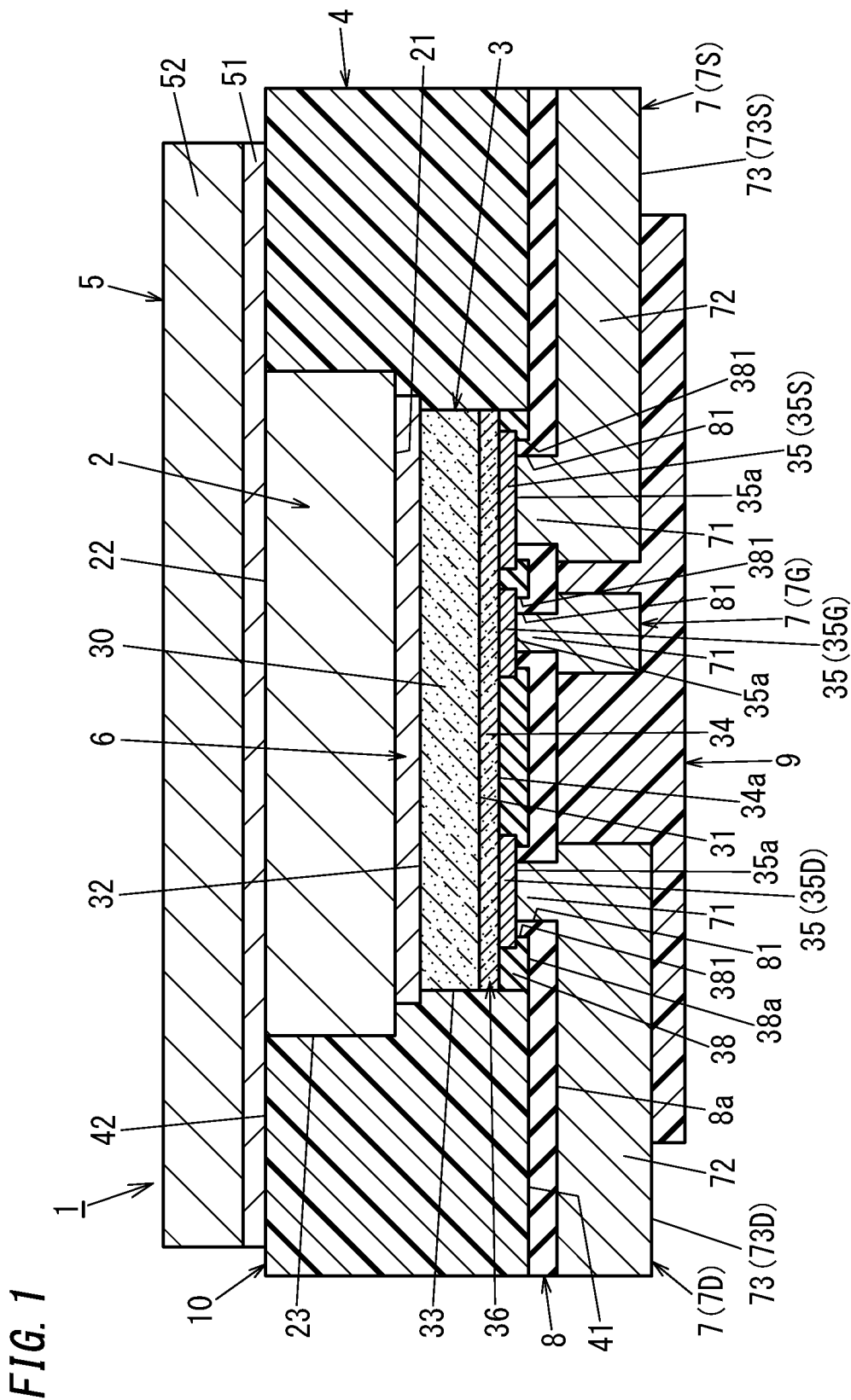
FIG. 1 is a cross-sectional view of a semiconductor device according to an exemplary embodiment of the present invention.
Figure 2:
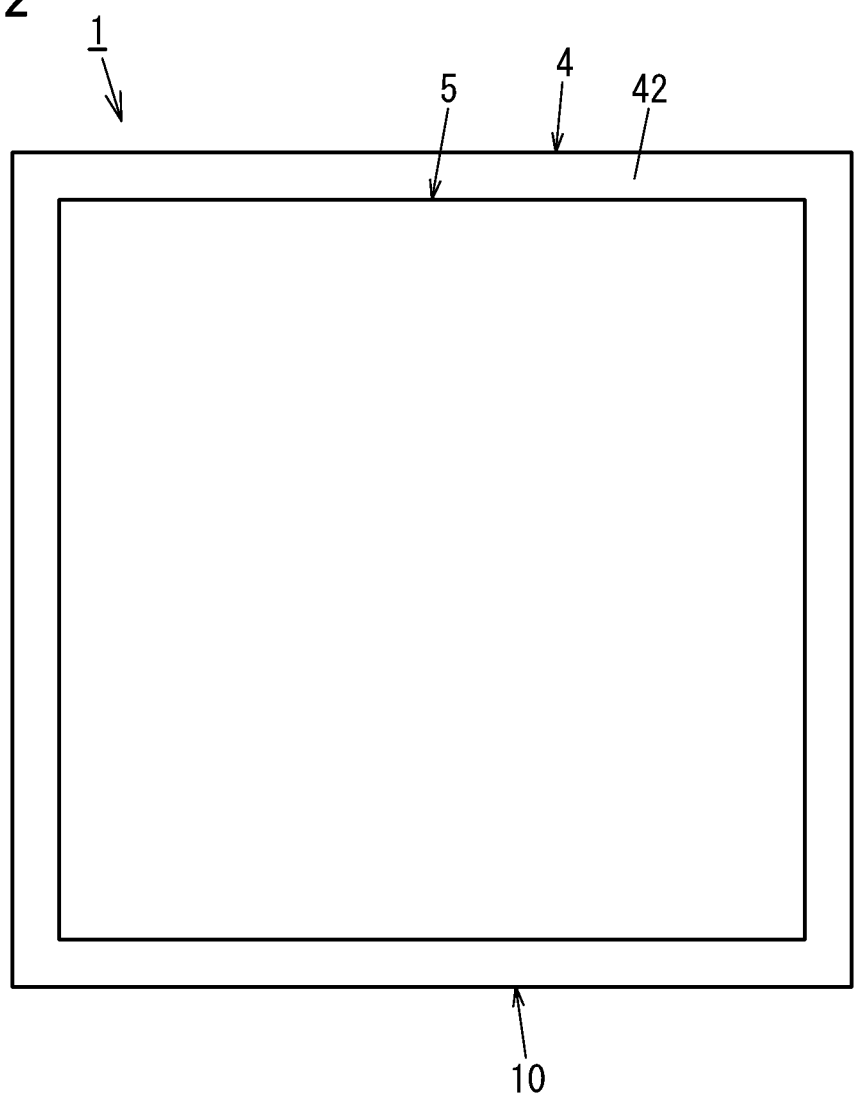
FIG. 2 is a plan view of the semiconductor device.

A semiconductor device 1 according to an exemplary embodiment will be described with reference to FIGS. 1-3, wherein FIG. 1 is a cross-sectional view taken along the plane X-X shown in FIG. 3.

A semiconductor device 1 includes a supporting substrate 2, a semiconductor chip 3, a resin member 4, and a heat-dissipating metal layer 5. The supporting substrate 2 has a first surface 21 and a second surface 22 that are located opposite from each other in a thickness direction defined for the supporting substrate 2. The semiconductor chip 3 includes a plurality of (e.g., three in this example) electrodes 35. The semiconductor chip 3 is bonded to the supporting substrate 2 on one side thereof with the first surface 21. The resin member 4 has a first surface 41 and a second surface 42 that are located opposite from each other in a thickness direction defined for the resin member 4. The resin member 4 covers a side surface 23 of the supporting substrate 2 and a side surface 33 of the semiconductor chip 3. The heat-dissipating metal layer 5 is arranged in contact with the supporting substrate 2 and the resin member 4 to cover the second surface 22 of the supporting substrate 2 and a part of the second surface 42 of the resin member 4, 4b partially.

This configuration allows the semiconductor device 1 to have improved heat dissipation properties as well as a reduced overall size.

The semiconductor device 1 further includes a plurality of (e.g., three in this example) conductor layers 7, each of which is electrically connected to an associated one of a plurality of (e.g., three in this example) electrodes 35. In this semiconductor device 1, part of each of these conductor layers 7 constitutes a terminal layer 73 to be connected to an external device. Thus, the semiconductor device 1 includes a package 10 including the resin member 4, the supporting substrate 2, the heat-dissipating metal layer 5, and the plurality of conductor layers 7. The semiconductor chip 3 is protected by the package 10.

The respective constituent elements of the semiconductor device 1 will now be described in further detail.

As described above, the semiconductor device 1 includes the supporting substrate 2, the semiconductor chip 3, the resin member 4, and the heat-dissipating metal layer 5.

The semiconductor chip 3 is a semiconductor element. The semiconductor chip 3 includes a transistor 36. In this embodiment, the semiconductor chip 3 includes a substrate 30 and the transistor 36. The substrate 30 has a principal surface 31 and a back surface 32 that are located opposite from each other along the thickness thereof. The transistor 36 is a lateral transistor including: a semiconductor layer 34 and the plurality of electrodes 35. The semiconductor layer 34 is formed on the principal surface 31 of the substrate 30. The plurality of electrodes 35 are arranged on one surface 34a, opposite from the substrate 30, of the semiconductor layer 34. The transistor 36 includes, as the plurality of electrodes 35, a source electrode 35S, a drain electrode 35D, and a gate electrode 35G.

The transistor 36 may be implemented as, for example, a GaN-based field effect transistor (FET). More specifically, the transistor 36 may be a type of normally off-mode GaN-based high electron mobility transistor (HEMT). The substrate 30 may be a silicon substrate, for example. Therefore, the substrate 30 is a type of conductive substrate. The principal surface 31 of the substrate 30 may be a (111) plane, for example. The semiconductor layer 34 of the transistor 36 may be an epitaxially grown layer formed on the substrate 30 by metalorganic vapor phase epitaxy (MOVPE) process. The semiconductor layer 34 may have a thickness on the order of a few μm, for example. The semiconductor layer 34 may include, for example, a buffer layer, an undoped GaN layer, an undoped AlGaN layer, and a p-type AlGaN layer, which are arranged in this order (i.e., stacked one on top of another) on the substrate 30. Thus, the semiconductor layer 34 has a heterojunction between the undoped GaN layer and the undoped AlGaN layer. Therefore, in the semiconductor layer 34, a two-dimensional electron gas is generated in the vicinity of the heterojunction. The buffer layer may be an undoped AlN layer, for example. In the semiconductor layer 34, the p-type AlGaN layer covers only a portion of the surface of the undoped AlGaN layer. Therefore, the surface 34a, opposite from the substrate 30, of the semiconductor layer 34 includes, on the surface of the undoped AlGaN layer, a portion not covered with the p-type AlGaN layer and the surface of the p-type AlGaN layer. The undoped GaN layer and the undoped AlGaN layer may include some impurities such as Mg, H, Si, C, and O to be inevitably contained during their growth.

In the transistor 36, the source electrode 35S, the gate electrode 35G, and the drain electrode 35D are provided on the surface 34a of the semiconductor layer 34. In one direction aligned with the surface 34a of the semiconductor layer 34, the source electrode 35S, the gate electrode 35G, and the drain electrode 35D are arranged in this order. In the one direction, the source electrode 35S, the gate electrode 35G, and the drain electrode 35D are spaced apart from each other. The source electrode 35S and the drain electrode 35D are formed on portions, not covered with the p-type AlGaN layer, of the undoped AlGaN layer. The gate electrode 35G is formed on the surface of the p-type AlGaN layer. This allows the transistor 36 to work as a normally off-mode transistor. The transistor 36 may include, instead of the p-type AlGaN layer, a gate layer formed out of a p-type metal oxide semiconductor layer (such as an NiO layer). When no voltage is applied between the gate electrode 35G and the source electrode 35S or between the drain electrode 35D and the source electrode 35S in the semiconductor device 1, the gate layer forms a depletion layer in the semiconductor layer 34. This allows the transistor 36 to operate as a normally off-mode transistor.

The semiconductor chip 3 further includes an electrical insulating layer 38. The electrical insulating layer 38 is formed on the surface 34a of the semiconductor layer 34. The electrical insulating layer 38 has a plurality of (e.g., three in this example) holes 381 that respectively expose the plurality of (e.g., three in this example) electrodes 35 (see FIGS. 1 and 4A). The electrical insulating layer 38 is an organic film with electrical insulation properties. The organic film may be a polyimide film, for example.

The semiconductor chip 3 has a rectangular shape in a plan view (i.e., a rectangular outer peripheral shape when viewed along the thickness thereof). However, this is only an example and should not be construed as limiting. Alternatively, the semiconductor chip 3 may also have a square shape in a plan view. In the semiconductor chip 3, the substrate 30 may have a thickness of 120 μm to 300 μm, for example. Note that this numerical value is only an example and should not be construed as limiting.

The semiconductor chip 3 is bonded to the supporting substrate 2. In this embodiment, the supporting substrate 2 has a rectangular shape in a plan view. However, this is only an example and should not be construed as limiting. Alternatively, the supporting substrate 2 may also have a square shape in a plan view. The planar dimensions of the supporting substrate 2 are larger than those of the semiconductor chip 3. The supporting substrate 2 has a first surface 21 and a second surface 22, that are located opposite from each other along thickness thereof. The semiconductor chip 3 is bonded to the supporting substrate 2 on one side thereof with the first surface 21.

The semiconductor device 1 includes a bonding portion 6 that bonds the semiconductor chip 3 and the supporting substrate 2 together. The bonding portion 6 is suitably formed out of a resin paste including metallic grains and having electrical conductivity, more particularly formed out of silver paste formed by dispersing silver grains in a paste, and is more suitably made of sintered silver. However, this is only an example and should not be construed as limiting. Alternatively, the bonding portion 6 may also be made of solder. As used herein, the sintered silver is a sintered material obtained by combining silver grains through sintering. The sintered silver is porous silver. When the bonding portion 6 is formed out of sintered silver, silver nano-paste, including silver nano-grains, a volatile binder, and a solvent, may be applied onto the first surface 21 of the supporting substrate 2, and then the semiconductor chip 3 may be placed on top of the supporting substrate 2 with the silver nano-paste interposed between them and the silver nano-paste may be heated to form the sintered silver. On the other hand, when the bonding portion 6 is formed out of solder, lead-free solder is suitably used. As the lead-free solder, AuSn may be used, for example. This allows the semiconductor device 1 to have increased thermal resistance compared to a situation where the bonding portion 6 is formed out of SnCuAg, which is a type of lead-free solder other than AuSn. This also enables the semiconductor device 1 to reduce the chances of the bonding portion 6 re-melting when the semiconductor device 1 is mounted onto a wiring board (such a printed wiring board) during the secondary implementation process. When the bonding portion 6 is formed out of solder, a solder bonding metal layer needs to be formed on each of the back surface 32 of the substrate 30 and the first surface 21 of the supporting substrate 2.

The supporting substrate 2 is a thermally conductive substrate made of a material with higher thermal conductivity than the resin member 4. The semiconductor device 1 with this configuration increases the chances of the heat generated by the semiconductor chip 3 being conducted to the heat-dissipating metal layer 5 via the supporting substrate 2 and dissipated from the heat-dissipating metal layer 5. The supporting substrate 2 may be implemented as a ceramic substrate, for example. The ceramic substrate for use as the supporting substrate 2 may be an aluminum nitride substrate, for example. However, this is only an example and should not be construed as limiting. Alternatively, the ceramic substrate may also be an alumina substrate, for example. The supporting substrate 2 may have a thickness of 600 μm, for example. Note that this numerical value is only an example and should not be construed as limiting.

The semiconductor device 1 includes the resin member 4 that covers the side surface 23 of the supporting substrate 2 and the side surface 33 of the semiconductor chip 3, as described above. The resin member 4 has a first surface 41 and a second surface 42, that are located opposite from each other along the thickness thereof. The resin member 4 may have a square outer peripheral shape when viewed in one direction along the thickness thereof. However, this is only an example and should not be construed as limiting. Alternatively, the resin member 4 may also have a rectangular outer peripheral shape, for example, in a plan view. The resin member 4 may have a thickness of about 0.9 mm, for example. The resin member 4 is made of an electrically insulating resin, and therefore, has electrical insulation properties. In this embodiment, the resin member 4 may be formed out of an encapsulating resin (such as an epoxy resin) and may have opacity. The encapsulating resin includes, for example, an epoxy resin, a black pigment, and a fill having a higher thermal conductivity than the epoxy resin. The black pigment may be carbon black, for example. The filler may be made of alumina, for example. Alternatively, the encapsulating resin may include, instead of the epoxy resin, an acrylic resin, a urethane resin, a silicone resin, or a fluorocarbon resin, for example.

In this semiconductor device 1, the surface 38a of the electrical insulating layer 38 of the semiconductor chip 3 is exposed through the resin member 4. More specifically, in the semiconductor device 1, the surface 38a of the electrical insulating layer 38 of the semiconductor chip 3 (hereinafter referred to as a "first electrical insulating layer 38") is substantially flush with the first surface 41 of the resin member 4. In addition, in this semiconductor device 1, the second surface 22 of the supporting substrate 2 is also exposed through the resin member 4. More specifically, in this semiconductor device 1, the second surface 22 of the supporting substrate 2 is substantially flush with the second surface 42 of the resin member 4.

The semiconductor device 1 further includes a second electrical insulating layer 8, which covers the surface 38a of the first electrical insulating layer 38 and the first surface 41 of the resin member 4. The second electrical insulating layer 8 may be an organic film such as a polyimide film, for example. In the semiconductor device 1 of this embodiment, the second electrical insulating layer 8 covers the boundary between the surface 38a of the first electrical insulating layer 38 of the semiconductor chip 3 and the first surface 41 of the resin member 4. That is to say, the second electrical insulating layer 8 is formed over the surface 38a of the first electrical insulating layer 38 and the first surface 41 of the resin member 4 so as to cover the boundary between the surface 38a of the first electrical insulating layer 38 and the first surface 41 of the resin member 4. This allows the semiconductor device 1 to have improved humidity resistance. In addition, in this semiconductor device 1, the second electrical insulating layer 8 may be formed out of a polyimide film, for example. This allows the degree of close contact between the second electrical insulating layer 8, the first electrical insulating layer 38, and the resin member 4 to be increased.

In this semiconductor device 1, the electrical insulating layer 38 has a plurality of holes 381 (hereinafter referred to as "first holes 381") that respectively expose the plurality of electrodes 35 as described above. Accordingly, the second electrical insulating layer 8 also has a plurality of second holes 81, each of which exposes the surface 35a of an associated one of the electrodes 35 inside a corresponding one of the plurality of first holes 381 of the first electrical insulating layer 38. In this embodiment, each of the second holes 81, located inside of the corresponding first hole 381, has a smaller opening area than the first hole 381.

The semiconductor device 1 includes a plurality of conductor layers 7 as described above. Each of the plurality of conductor layers 7 is a plated layer. Each of the plurality of conductor layers 7 may be a multilayer stack of a titanium film and a copper film, for example. In this embodiment, the titanium film may have a thickness of 0.1 µm and the copper film may have a thickness of 100 µm, for example. The plurality of conductor layers 7 are formed along respective surfaces 35a of the plurality of electrodes 35 of the semiconductor chip 3, the surface 38a of the first electrical insulating layer 38, and the first surface 41 of the resin member 4. More specifically, each of the plurality of conductor layers 7 is formed over the surface 35a of an associated one of the electrodes 35 and the surface 8a of the second electrical insulating layer 8. In this embodiment, a portion of each of the plurality of conductor layers 7 is formed, inside a corresponding one of the second holes 81, on the surface 35a of the associated one of the plurality of electrodes 35. The portion of each of the plurality of conductor layers 7 is formed to cover the surface 35a of the associated electrode 35 and the inner surface of the corresponding second hole 81 such that the second hole 81 is filled with the portion of the conductor layer 7. Each of the plurality of conductor layers 7 is electrically connected to the associated one of the plurality of electrodes 35 (i.e., the electrode 35 with which the conductor layer 7 is in contact). In this semiconductor device 1, there is no need to connect a bonding wire to any electrode 35, thus preventing a wire bonding process from doing damage to the semiconductor chip 3. In addition, in this semiconductor device 1, not a bonding wire but the conductor layer 7 is connected to each of the electrodes 35, thus allowing the inductance component of the package 10 to be reduced. In the following description, the conductor layer 7 electrically connected to the source electrode 35S will be hereinafter referred to as a "source interconnect layer 7S," the conductor layer 7 electrically connected to the gate electrode 35G will be hereinafter referred to as a "gate interconnect layer 7G," and the conductor layer 7 electrically connected to the drain electrode 35D will be hereinafter referred to as a "drain interconnect layer 7D."

In the known art, an Al wire with a diameter of 100 µm to 500 µm has been used as a bonding wire for power semiconductor elements. In contrast, in this semiconductor device 1, the portion, exposed through the second hole 81, of the surface 35a of each electrode 35 has a shape connoting a circle with a diameter of 500 µm. More specifically, the area of the portion, exposed through the second hole 81, of the surface 35a of each electrode 35 is larger than a bonding area between an Al wire and the electrode 35 when the Al wire is supposed to be wire-bonded to the electrode 35. In this semiconductor device 1, a cross-sectional area, perpendicular to a current flowing direction, of each conductor layer 7 is larger than the cross-sectional area of such an Al wire with a diameter of 500 µm.

Each of the plurality of conductor layers 7 includes a first interconnect layer 71 and a second interconnect layer 72. The first interconnect layer 71 is arranged in contact with the surface 35a of an associated one of the plurality of electrodes 35 and located inside of a corresponding one of the plurality of second holes 81. The second interconnect layer 72 is formed on the surface 8a of the second electrical insulating layer 8. In each of the plurality of conductor layers 7, the second interconnect layer 72 suitably has a line width equal to or greater than that of the first interconnect layer 71. This allows the semiconductor device 1 to efficiently dissipate heat from each of the plurality of conductor layers 7 and thereby improve the heat dissipation properties thereof. In this case, at least a portion of the second interconnect layer 72 suitably has a broader line width than the first interconnect layer 71.

Each of the plurality of conductor layers 7 includes a terminal layer 73 arranged opposite from the first interconnect layer 71 with respect to the second interconnect layer 72. The terminal layer 73 is formed on the surface 8a of the second electrical insulating layer 8. Thus, the terminal layer 73 is formed along the first surface 41 of the resin member 4. The terminal layer 73 may serve as a terminal to be connected to an external device. In each of the conductor layers 7, the second interconnect layer 72 and the terminal layer 73 may have a thickness of about 100 µm, for example. In this semiconductor device 1, the electrodes 35 of the semiconductor chip 3 and the terminal layer 73 are electrically connected together via the first interconnect layer 71 and the second interconnect layer 72 without using any bonding wires. This allows the semiconductor device 1 to have a reduced overall size and operate with more reliability as well by reducing the parasitic inductance in the package 10. In addition, this also allows the semiconductor device 1 to increase the switching speed of the transistor 36 of the semiconductor chip 3.

The semiconductor device 1 further includes, on the second surface 42, opposite from the first surface 41, of the resin member 4, a heat-dissipating metal layer 5 covering the second surface 22 of the supporting substrate 2 and a part of the second surface 42 of the resin member 4. In this embodiment, the heat-dissipating metal layer 5 is in contact with the second surface 22 of the supporting substrate 2 and a part of the second surface 42 of the resin member 4. More specifically, the heat-dissipating metal layer 5 is in contact with the entire second surface 22 of the supporting substrate 2 and a part of the second surface 42 of the resin member 4. In this embodiment, the heat-dissipating metal layer 5 has a square shape in a plan view. However, this is only an example and should not be construed as limiting. Alternatively, the heat-dissipating metal layer 5 may also have a rectangular shape in a plan view, for example. The planar dimensions of the heat-dissipating metal layer 5 are larger than those of the supporting substrate 2. In this embodiment, the planar dimensions of the heat-dissipating metal layer 5 are smaller than those of the resin member 4. However, this is only an example and should not be construed as limiting. Alternatively, the planar dimensions of the heat-dissipating metal layer 5 may be the same as those of the resin member 4. From the standpoint of improving the heat dissipation properties, the planar dimensions of the heat-dissipating metal layer 5 are suitably as large as possible.

The heat-dissipating metal layer 5 includes a first metal layer 51 and a second metal layer 52. The first metal layer 51 is in contact with the second surface 22 of the supporting substrate 2 and the second surface 42 of the resin member 4. The second metal layer 52 is arranged opposite from the supporting substrate 2 and the resin member 4 with respect to the first metal layer 51. In this heat-dissipating metal layer 5, the second metal layer 52 may be made of copper and the first metal layer 51 may be made of titanium, for example. The material for the first metal layer 51 suitably achieves a closer contact with the resin member 4 and the supporting substrate 2 than the material for the second metal layer 52. In this embodiment, the second metal layer 52 is made of copper. However, this is only an example and should not be construed as limiting. Alternatively, the second metal layer 52 may also be made of aluminum, for example. The material for the first metal layer 51 does not have to be titanium but may also be chromium, nickel, or any other suitable material.

In the heat-dissipating metal layer 5, the second metal layer 52 is thicker than the first metal layer 51. In the heat-dissipating metal layer 5, the first metal layer 51 has a thickness of 500 nm, for example, and the second metal layer 52 may have a thickness of 100 μm, for example. Note that these numerical values are only examples and should not be construed as limiting. The first metal layer 51 suitably has a thickness falling within the range from about 100 nm to about 1000 nm. The second metal layer 52 suitably has a thickness falling within the range from about 18 μm to about 500 μm, for example. In this heat-dissipating metal layer 5, metallic grains of the first metal layer 51 have a smaller average grain size (average crystal grain size) than metallic grains of the second metal layer 52. The heat-dissipating metal layer 5 is formed by plating. As used herein, the "plating" refers to plating in a broader sense of the word, and means placing a metal onto a target. The plating herein includes dry plating and wet plating. The first metal layer 51 is formed by dry plating (e.g., sputtering in this example). The second metal layer 52 is formed by wet plating (e.g., electroplating in this example). This allows the semiconductor device 1 to not only increase the degree of close contact between the heat-dissipating metal layer 5, the supporting substrate 2, and the resin member 4 but also thicken the heat-dissipating metal layer 5 easily as well.

In this heat-dissipating metal layer 5, the metallic grains of the first metal layer 51 have an average crystal grain size of 1 nm to 200 nm, for example, and the metallic grains of the second metal layer 52 have an average crystal grain size of 5 μm to 20 μm, for example. As used herein, the "average crystal grain size" is a value calculated based on the average of crystal grain sizes of metallic grains by observing, with a scanning electron microscope (SEM), a cross section of a sample cut out along the thickness of the heat-dissipating metal layer 5 to obtain a sectional SEM image and by subjecting the sectional SEM image to image processing. More specifically, the "crystal grain size" is the diameter of a circle, of which the area is equal to the area of a metallic grain extracted from the sectional SEM image, and the "average crystal grain size" is the average of the crystal grain sizes of a predetermined number of (e.g., 50) metallic grains. When the relative magnitudes of average crystal grain sizes are discussed, the average crystal grain size does not have to be such an average but may also be a median diameter ($d_{50}$) obtained from a number grain size distribution curve. The number grain size distribution curve may be obtained by measuring the grain size distribution by an imaging method. Specifically, the number grain size distribution curve is a curve obtained based on the sizes (biaxial average sizes) and number of metallic grains, of which the data is acquired by subjecting the SEM image to image processing. In the number grain size distribution curve, the grain size value when the integrated value is 50% is called the "median diameter ($d_{50}$)."

The semiconductor device 1 further includes a third electrical insulating layer 9. The third electrical insulating layer 9 covers the first interconnect layer 71 and second interconnect layer 72 of each of the plurality of conductor layers 7 and the second electrical insulating layer 8. The third electrical insulating layer 9 may be implemented as a solder resist layer, for example. However, this is only an example and should not be construed as limiting. The third electrical insulating layer 9 may also be any other layer with electrical insulation properties. The terminal layer 73 of each of the plurality of conductor layers 7 is an exposed portion, not covered with the third electrical insulating layer 9, of the conductor layer 7. In the following description, the terminal layer 73 of the gate interconnect layer 7G will be hereinafter referred to as a "gate terminal layer 73G," the terminal layer 73 of the source interconnect layer 7S will be hereinafter referred to as a "source terminal layer 73S," and the terminal layer 73 of the drain interconnect layer 7D will be hereinafter referred to as a "drain terminal layer 73D."

A semiconductor device 1 according to the exemplary embodiment described above includes a supporting substrate 2, a semiconductor chip 3, a resin member 4, and a heat-dissipating metal layer 5. The supporting substrate 2 has a first surface 21 and a second surface 22 that are located opposite from each other in a thickness direction defined for the supporting substrate 2. The semiconductor chip 3 includes a plurality of (e.g., three in this example) electrodes 35. The semiconductor chip 3 is bonded to the supporting substrate 2 on one side thereof with the first surface 21. The resin member 4 has a first surface 41 and a second surface 42 that are located opposite from each other in a thickness direction defined for the resin member 4. The resin member 4 covers a side surface 23 of the supporting substrate 2 and a side surface 33 of the semiconductor chip 3. The heat-dissipating metal layer 5 is arranged in contact with the supporting substrate 2 and the resin member 4 to cover the second surface 22 of the supporting substrate 2 and a part of the second surface 42 of the resin member 4. This configuration allows the semiconductor device 1 to have improved heat dissipation properties as well as a reduced overall size.

In this semiconductor device 1, the thickness of the package 10 is the sum of the thickness of the resin member 4, the thickness of the heat-dissipating metal layer 5, the thickness of the second electrical insulating layer 8, the thickness of the second interconnect layer 72 on the surface 8a of the second electrical insulating layer 8, and the thickness of the third electrical insulating layer 9 on the second interconnect layer 72, and may be about 1 mm, for example.

Next, an exemplary method for fabricating the semiconductor device 1 will be described with reference to FIGS. 4A-7B.

Figure 4A:
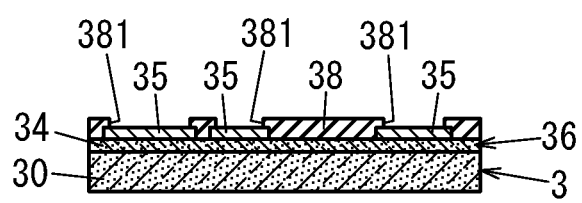
FIGS. 4A-4C are cross-sectional views illustrating main process steps of a method for fabricating the semiconductor device.

According to this method for fabricating the semiconductor device 1, first of all, a semiconductor chip 3 is provided (see FIG. 4A).

According to this method for fabricating the semiconductor device 1, after the semiconductor chip 3 has been provided, the following first through tenth process steps are performed sequentially.

Figure 4B:
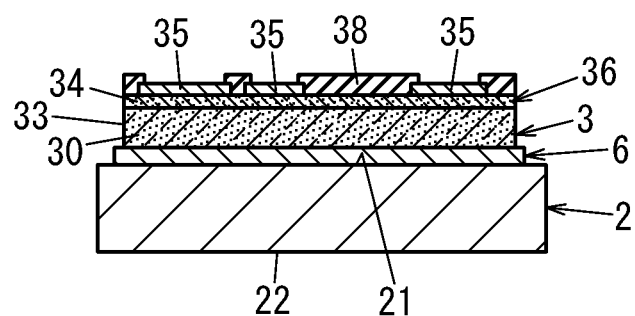

In the first process step, the semiconductor chip 3 and a supporting substrate 2 are bonded together (see FIG. 4B). Specifically, in the first process step, the semiconductor chip 3 and the supporting substrate 2 are bonded together with a bonding portion 6.

Figure 4C:
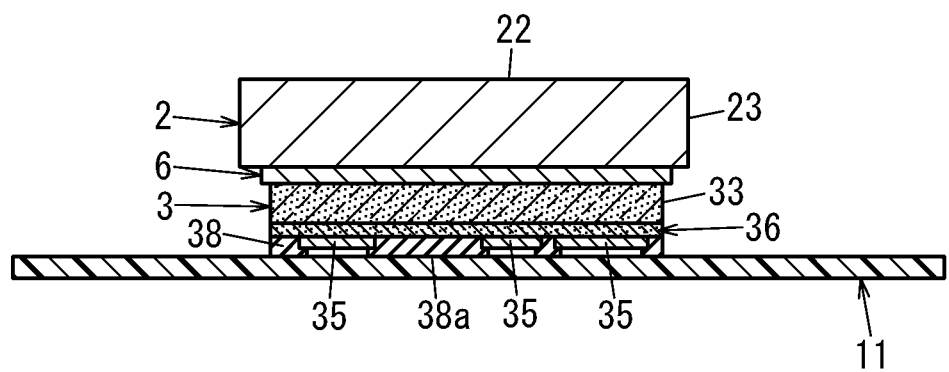

In the second process step, the semiconductor chip 3 to which the supporting substrate 2 has been bonded is placed in such a position where the surface 38a of a first electrical insulating layer 38 of the semiconductor chip 3 faces a supporting sheet 11, and the semiconductor chip 3 is adhered onto the supporting sheet 11 (see FIG. 4C). The supporting sheet 11 may be an adhesive sheet, for example. The adhesive sheet includes, for example, a sheet body and an adhesive layer provided on one of two surfaces along the thickness of the sheet body. The sheet body may be a resin sheet, for example. The material for the resin sheet may be polyethylene terephthalate, for example. The adhesive layer is suitably made of an adhesive, which is adherent to the first electrical insulating layer 38 and of which the adhesiveness may be decreased when exposed to any of an ultraviolet ray, an infrared ray, or heat. The adhesive layer may be made of, for example, an acrylic resin adhesive, a urethane resin adhesive, a silicone resin adhesive, or an epoxy resin adhesive.

Figure 5A:
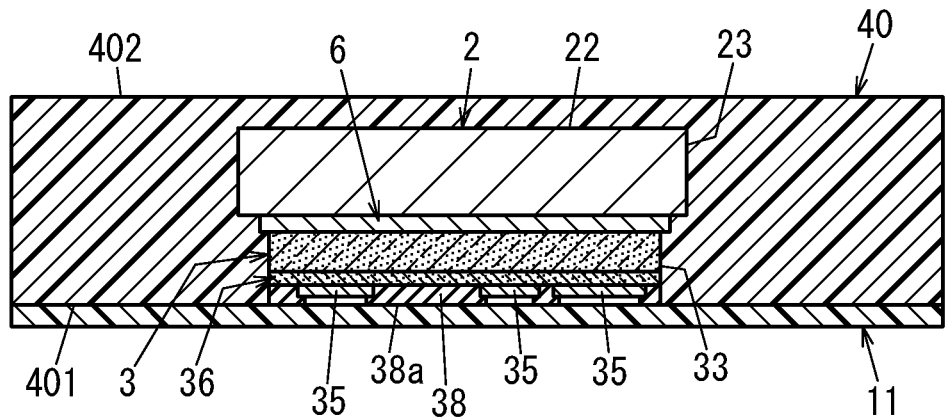
FIGS. 5A-5C are cross-sectional views illustrating main process steps of the method for fabricating the semiconductor device.

In the third process step, a resin layer 40 as a prototype of a resin member 4 is formed over the supporting sheet 11 so as to cover the semiconductor chip 3 and the supporting substrate 2 (see FIG. 5A). In this embodiment, the resin layer 40 has a first surface 401 and a second surface 402 that are located opposite from each other along the thickness thereof. The resin layer 40 covers the side surface 33 of the semiconductor chip 3, and the side surface 23 and second surface 22 of the supporting substrate 2. Thus, the resin layer 40 is thicker than the resin member 4. In this process step, part of the resin layer 40 is interposed between the second surface 402 of the resin layer 40 and the second surface 22 of the supporting substrate 2. The first surface 401 of the resin layer 40 is in contact with the supporting sheet 11. The first surface 401 of the resin layer 40 is substantially flush with the surface 38a of the first electrical insulating layer 38 of the semiconductor chip 3. The second surface 402 of the resin layer 40 is located opposite from the first surface 41 thereof. In this third process step, the resin layer 40 is formed by press molding. However, this is only an example and should not be construed as limiting. Alternatively, the resin layer 40 may also be formed in this third process step by applying, by spin coating, doctor blading, potting, transfer molding, compression molding, or any other suitable method, the material for the resin layer 40 over the supporting sheet 11, the semiconductor chip 3, and the supporting substrate 2 and then curing the material either thermally or by exposure to an ultraviolet ray. Still alternatively, in this third process step, the resin layer 40 may also be formed by attaching a thermosetting resin sheet onto the supporting sheet 11 to cover the supporting sheet 11, the semiconductor chip 3, and the supporting substrate 2 and then curing the resin sheet thermally.

Figure 5B:
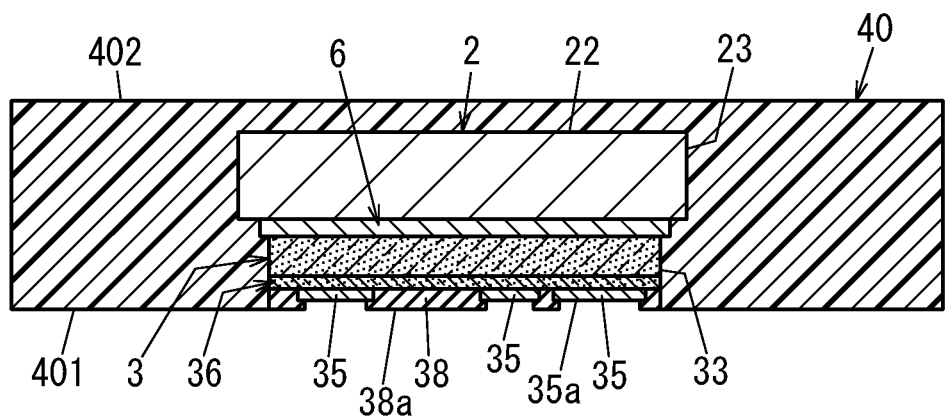

In the fourth process step, the supporting sheet 11 is stripped from the resin layer 40 and the semiconductor chip 3 (see FIG. 5B). At this time, in the fourth process step, the supporting sheet 11 is stripped from the resin layer 40 and the semiconductor chip 3 by causing a decrease in the adhesiveness of the adhesive layer of the supporting sheet 11. This allows, as a result of this fourth process step, the first surface 401 of the resin layer 40, the surface 38a of the first electrical insulating layer 38 of the semiconductor chip 3, and the surface 35a of the plurality of electrodes 35 to be exposed.

Figure 5C:
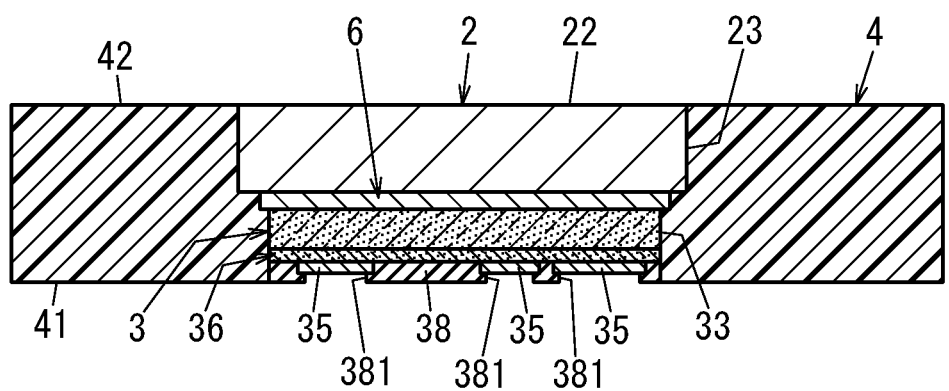

In the fifth process step, a resin member 4 is formed by polishing, from the second surface 402 opposite from the first surface 401, the resin layer 40 until the thickness of the resin layer 40 decreases to the thickness of the resin member 4 (see FIG. 5C). That is to say, in this fifth process step, the resin layer 40 is polished such that the second surface 22 of the supporting substrate 2 is exposed and the second surface 402 of the resin layer 40 becomes substantially flush with the second surface 22 of the supporting substrate 2. Nevertheless, in this fifth process step, the second surface 22 of the supporting substrate 2 needs to be exposed but the second surface 402 of the resin layer 40 does not have to be flush with the second surface 22 of the supporting substrate 2. In this fifth process step, there is no need to polish the first surface 401 of the resin layer 40, thus reducing the chances of doing damage to the semiconductor chip 3.

Figure 6A:
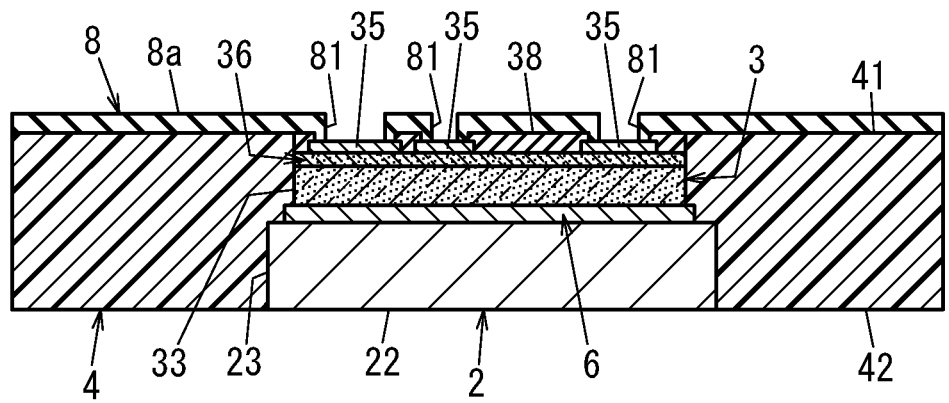
FIGS. 6A-6C are cross-sectional views illustrating main process steps of the method for fabricating the semiconductor device.

In theسSixth process step, a second electrical insulating layer 8 is formed out of a polyimide film by photolithographic technique, for example (see FIG. 6A).

Figure 6B:
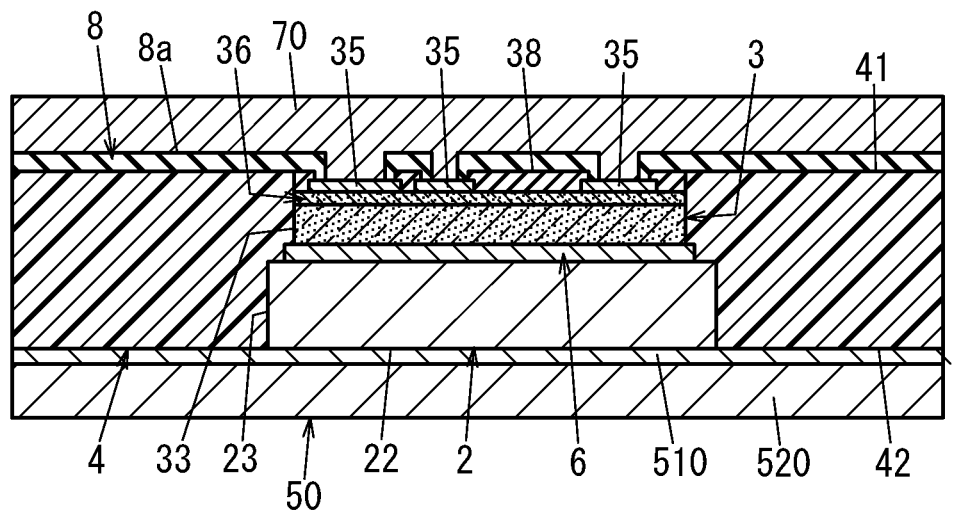

In the seventh process step, metal layers 50 and 70 are formed by plating as a prototype of a heat-dissipating metal layer 5 and as a prototype of a plurality of conductor layers 7, respectively (see FIG. 6B). The metal layer 50 is a multilayer stack of a first metal film 510 (such as a titanium film) formed by dry plating (such as sputtering) and a second metal film 520 (such as a copper film) formed on the first metal film 510 by wet plating (such as electroplating). The first metal film 510 is a film to be patterned into the first metal layer 51. The second metal film 520 is a film to be patterned into the second metal layer 52. The metal layer 70 is a multilayer stack of a third metal film (such as a titanium film) formed by dry plating (such as sputtering) and a fourth metal film (such as a copper film) formed on the third metal film by wet plating (such as electroplating).

Figure 6C:
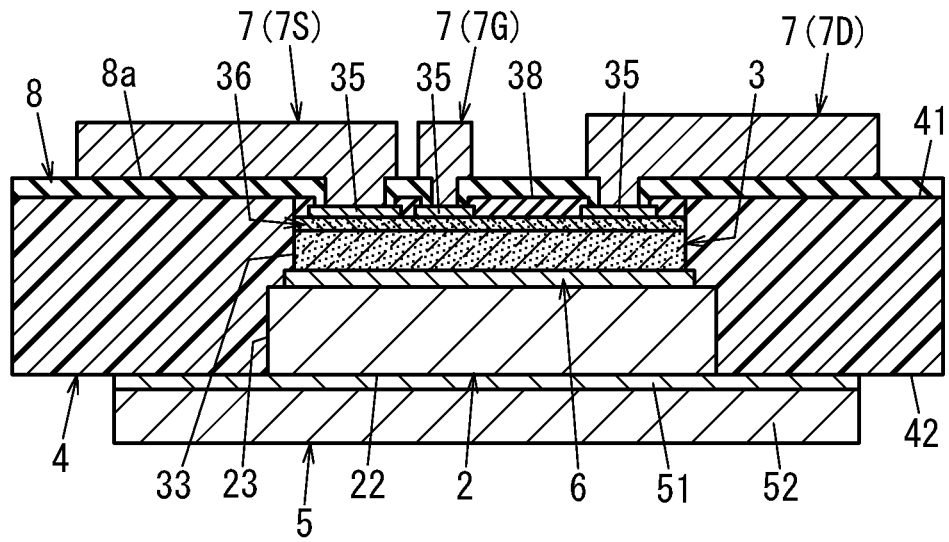

In the eighth process step, the metal layer 50 is patterned by, for example, photolithography and etching techniques to form the heat-dissipating metal layer 5, and the metal layer 70 is patterned by, for example, photolithography and etching techniques to form the plurality of conductor layers 7 (see FIG. 6C).

Figure 7A:
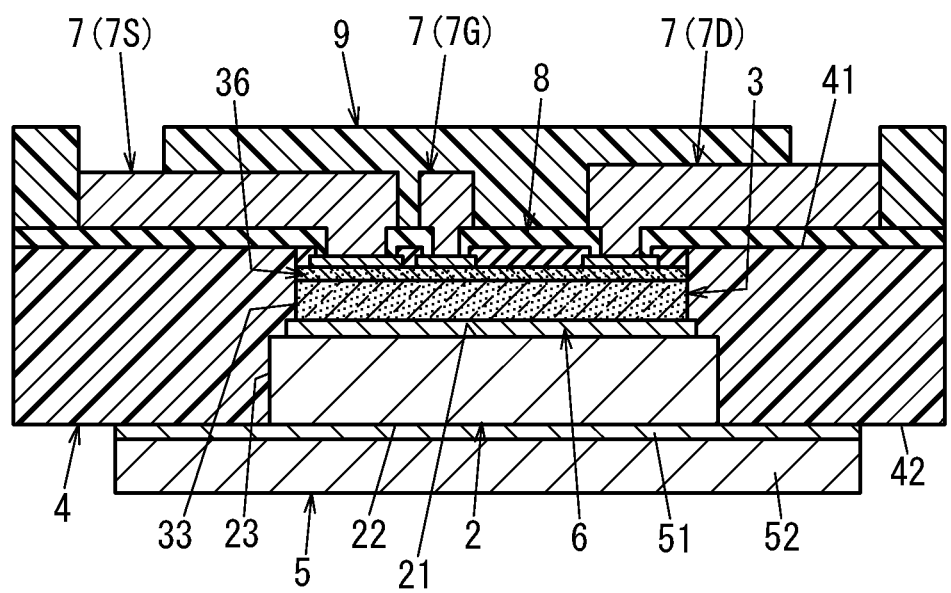
FIGS. 7A and 7B are cross-sectional views illustrating main process steps of the method for fabricating the semiconductor device.

In the ninth process step, a third electrical insulating layer 9 is formed out of a solder resist layer by, for example, photolithographic technique (see FIG. 7A).

If a plurality of semiconductor chips 3 are adhered onto the supporting sheet 11 in the second process step, a set of semiconductor devices 1 may be formed by performing the second through ninth process steps.

Figure 7B:
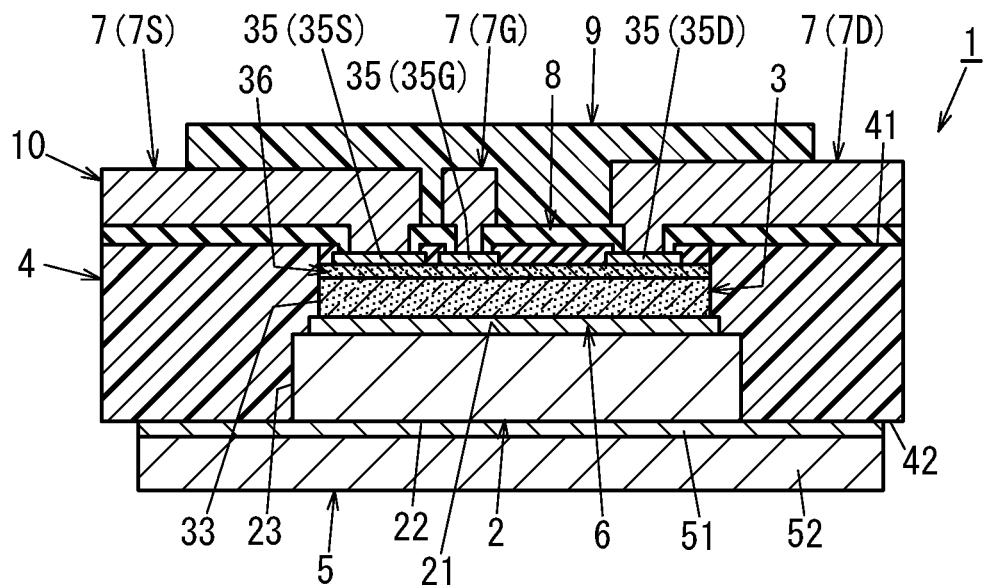

In that case, in the tenth process step, the set of semiconductor devices 1 is divided into respective semiconductor devices 1 with a dicing saw, for example, to obtain a plurality of semiconductor devices 1 (only one of which is shown in FIG. 7B).

In the method for fabricating the semiconductor device 1, the fourth and fifth process steps may be performed in reverse order.

In the method for fabricating the semiconductor device 1 described above, in order to form the heat-dissipating metal layer 5, a metal layer 50 as a prototype of the heat-dissipating metal layer 5 is formed by plating in contact with the second surface 22 of the supporting substrate 2 and the second surface 42 of the resin member 4 (in the seventh process step) and then patterned to form the heat-dissipating metal layer 5 out of a part of the metal layer 50 (in the eighth process step). This allows a semiconductor device 1 with not only a reduced overall size but also improved heat dissipation properties to be provided by this method for fabricating the semiconductor device 1.

In addition, in the method for fabricating the semiconductor device 1, in order to form the heat-dissipating metal layer 5, a first metal film 510 as a prototype of the first metal layer 51 is formed by dry plating in contact with the second surface 22 of the supporting substrate 2 and the second surface 42 of the resin member 4. Next, after the first metal film 510 has been formed, a second metal film 520 as a prototype of the second metal layer 52 is formed by wet plating on the first metal film 510 such that the second metal film 520 is arranged opposite from the supporting substrate 2 and the resin member 4 with respect to the first metal film 510 (in the seventh process step). Then, a metal layer 50 as a multilayer stack including the first metal film 510 and the second metal film 520 is patterned to form the heat-dissipating metal layer 5 out of a part of the metal layer 50 (in the eighth process step). This allows a semiconductor device 1 with not only a reduced overall size but also improved heat dissipation properties to be provided by this method for fabricating the semiconductor device 1.

Furthermore, in the method for fabricating the semiconductor device 1, the semiconductor chip 3 and the supporting substrate 2 are bonded together (in the first process step). Thereafter, a resin layer 40 is formed as a prototype of the resin member 4 so as to cover the side surface 23 of the supporting substrate 2, the side surface 33 of the semiconductor chip 3, and the second surface 22 of the supporting substrate 2 (in the third process step). Next, the resin layer 40 is polished to the point of exposing the second surface 22 of the supporting substrate 2 to form the resin member 4 out of a part of the resin layer 40 (in the fifth process step). Then, the heat-dissipating metal layer 5 and the plurality of conductor layers 7 are formed by plating (in the seventh and eighth process steps). This allows a semiconductor device 1 with not only a reduced overall size but also improved heat dissipation properties to be provided by this method for fabricating the semiconductor device 1.

Note that the embodiment described above is only an exemplary one of various embodiments of the present invention and should not be construed as limiting. Rather, the embodiment described above may be readily modified in various manners, depending on a design choice or any other factor, without departing from a true spirit and scope of the present invention.

Figure 8:
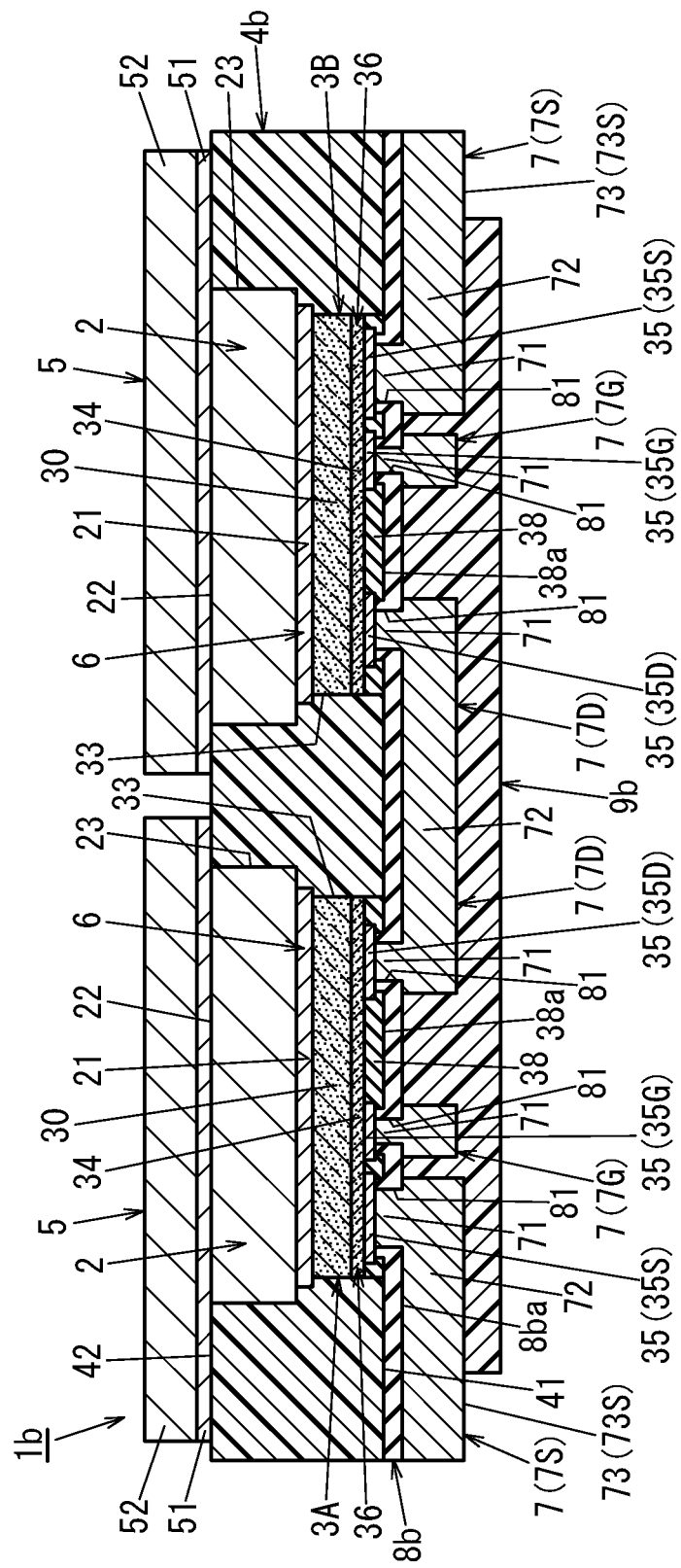
FIG. 8 is a cross-sectional view of a semiconductor device according to a first variation of the exemplary embodiment of the present invention.

FIG. 8 is a cross-sectional view of a semiconductor device 1b according to a first variation of the exemplary embodiment. In the following description, any constituent element of the semiconductor device 1b according to the first variation, having the same function as a counterpart of the semiconductor device 1 according to the exemplary embodiment described above, will be designated by the same reference numeral as that counterpart's, and description thereof will be omitted herein.

The semiconductor device 1b according to the first variation includes two semiconductor chips 3A and 3B instead of the semiconductor chip 3 of the semiconductor device 1 according to the exemplary embodiment. Each of these two semiconductor chips 3A and 3B includes the same constituent elements as the semiconductor chip 3. The only difference between the semiconductor devices 1b and 1 lies in the layout of the plurality of electrodes 35 and the plurality of conductor layers 7. The two semiconductor chips 3A and 3B are arranged such that their respective side surfaces 33 face each other.

In the semiconductor device 1b according to the first variation, the electrodes 35 and 35 (e.g., the drain electrodes 35D and 35D in this example), performing the same function, of the two semiconductor chips 3A and 3B are electrically connected together via the conductor layers 7 and 7 connected to those electrodes 35 and 35, respectively. That is to say, in this semiconductor device 1, the respective drain electrodes 35D and 35D of the semiconductor chips 3A and 3B are electrically connected together to connect the two transistors 36 and 36 in anti-series. This allows the semiconductor device 1b according to the first variation to be used as a bidirectional switch with a common drain.

In addition, the semiconductor device 1b according to the first variation includes a single resin member 4b covering the respective side surfaces 33 of the two semiconductor chips 3A and 3B and the respective side surfaces 23 of the two supporting substrates 2 instead of the resin member 4 of the semiconductor device 1 according to the exemplary embodiment. In addition, the semiconductor device 1b according to the first variation includes a second electrical insulating layer 8b instead of the second electrical insulating layer 8 of the semiconductor device 1 according to the exemplary embodiment. The second electrical insulating layer 8b covers the surface 38a of the first electrical insulating layer 38 of the semiconductor chip 3A, the surface 38a of the first electrical insulating layer 38 of the semiconductor chip 3B, and the first surface 41 of the resin member 4b. The second interconnect layer 72 and the terminal layer 73 are formed on the surface 8ba of the second electrical insulating layer 8b.

Compared to a semiconductor device of a comparative example in which the respective drain electrodes 35D of the two transistors 36 and 36 are electrically connected together with Al bonding wires, for example, the semiconductor device 1b according to the first variation is able to reduce the value of the resistance and inductance components between the drain electrodes 35D and 35D. This allows the semiconductor device 1b according to the first variation to perform a switching operation with more stability and further cut down the energy loss. In addition, the semiconductor device 1b according to the first variation has further improved heat dissipation properties and is able to operate with even more stability.

Next, a method for fabricating the semiconductor device 1b according to the first variation will be described with reference to FIGS. 9A-12B. The method for fabricating the semiconductor device 1b according to the first variation is substantially the same as the method for fabricating the semiconductor device 1 according to the exemplary embodiment. Thus, description of their common process steps will be omitted as appropriate.

In the method for fabricating the semiconductor device 1b, semiconductor chips 3A and 3B are provided, and then the first through tenth process steps are performed sequentially.

In the first process step, the semiconductor chip 3A and a supporting substrate 2 are bonded together and the semiconductor chip 3B and another supporting substrate 2 are bonded together (see FIG. 9A). Specifically, in the first process step, the semiconductor chip 3A and the supporting substrate 2 are bonded together with a bonding portion 6, and the semiconductor chip 3B and the other supporting substrate 2 are bonded together with a bonding portion 6.

In the second process step, the semiconductor chip 3A to which the supporting substrate 2 has been bonded is placed in such a position where the surface 38a of a first electrical insulating layer 38 of the semiconductor chip 3A faces a supporting sheet 11, and the semiconductor chip 3A is adhered onto the supporting sheet 11, and the semiconductor chip 3B to which the supporting substrate 2 has been bonded is placed in such a position where the surface 38a of a first electrical insulating layer 38 of the semiconductor chip 3B faces the supporting sheet 11, and the semiconductor chip 3B is adhered onto the supporting sheet 11 (see FIG. 9B).

In the third process step, a resin layer 40b as a prototype of the resin member 4b is formed over the supporting sheet 11 so as to cover the semiconductor chip 3A with the supporting substrate 2 and the semiconductor chip 3B with the supporting substrate 2 (see FIG. 9C). In this embodiment, the resin layer 40b has a first surface 401 and a second surface 402 that are located opposite from each other along the thickness thereof.

Figure 10A:
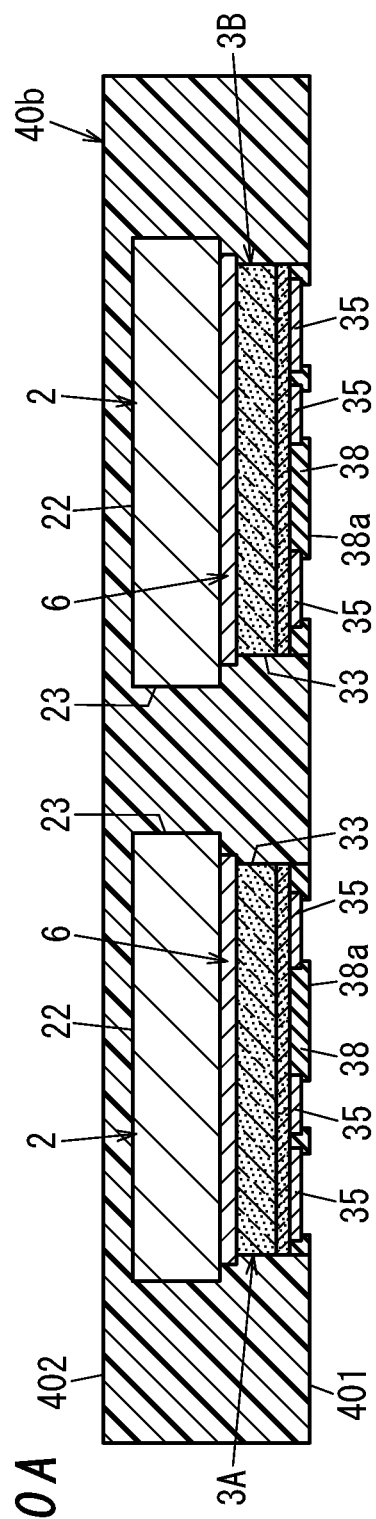
FIGS. 10A-10C are cross-sectional views illustrating main process steps of the method for fabricating the semiconductor device.

In the fourth process step, the supporting sheet 11 is stripped from the resin layer 40b and the two semiconductor chips 3A and 3B (see FIG. 10A).

Figure 10B:
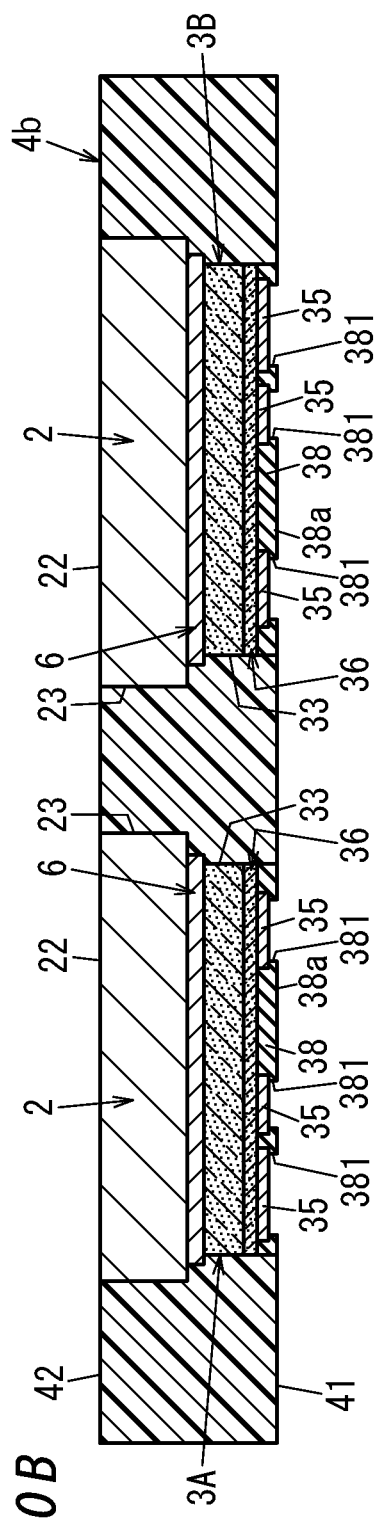

In the fifth process step, the resin member 4b is formed by polishing, from the second surface 402 opposite from the first surface 401, the resin layer 40b until the thickness of the resin layer 40b decreases to the thickness of the resin member 4b (see FIG. 10B).

Figure 10C:
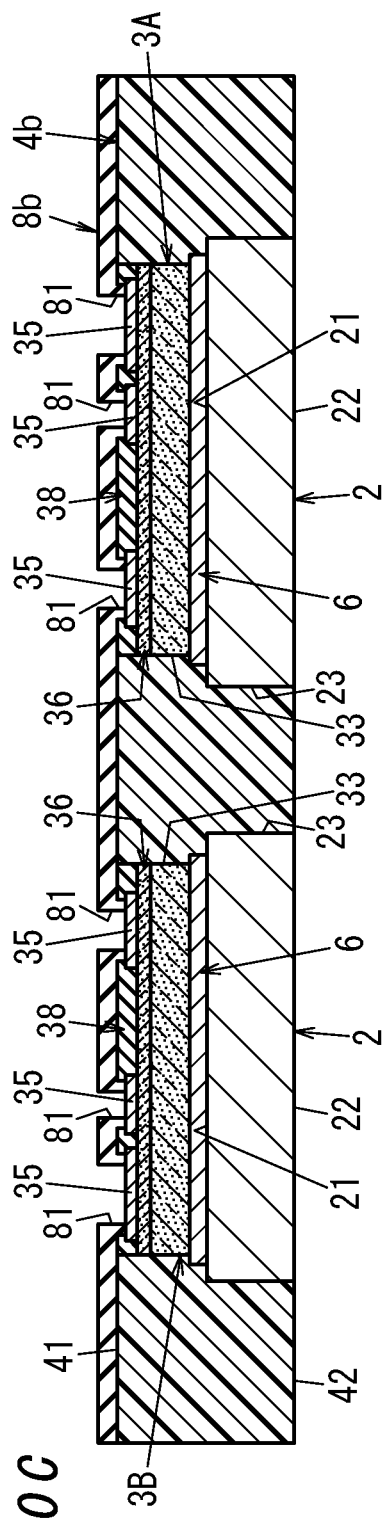

In the sixth process step, a second electrical insulating layer 8b is formed out of a polyimide film by photolithographic technique, for example (see FIG. 10C).

Figure 11A:
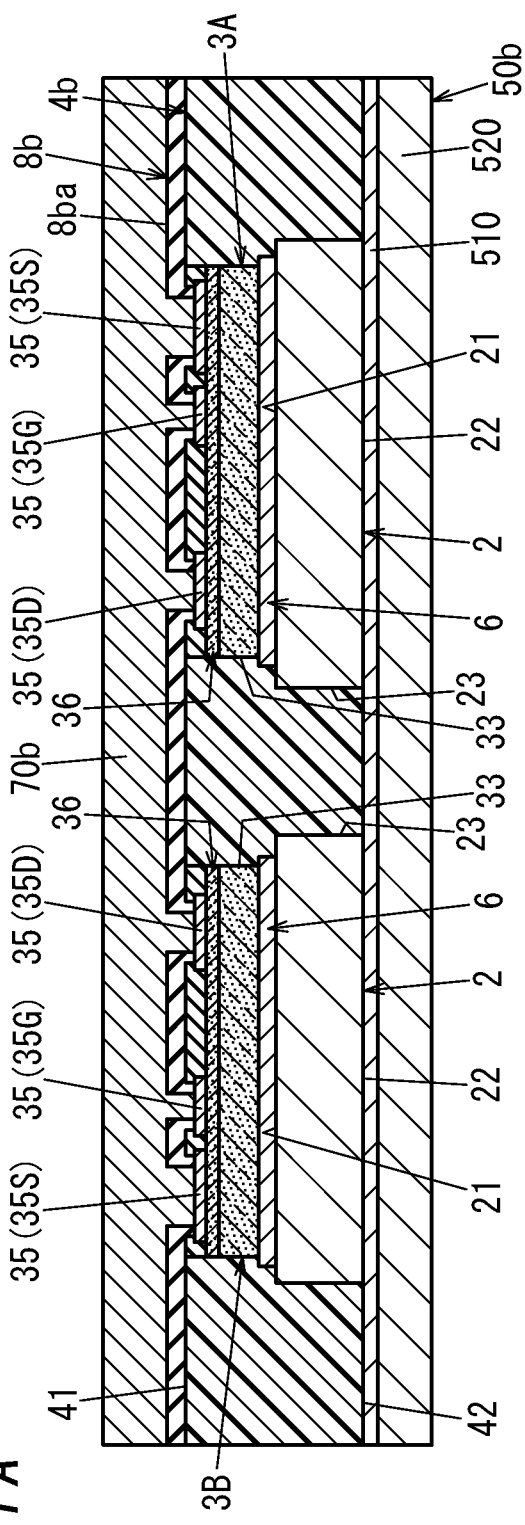
FIGS. 11A and 11B are cross-sectional views illustrating main process steps of the method for fabricating the semiconductor device.

In the seventh process step, metal layers 50b and 70b are formed by plating as a prototype of two heat-dissipating metal layers 5 and as a prototype of a plurality of conductor layers 7 to be provided for each of the two semiconductor chips 3A and 3B, respectively (see FIG. 11A). The metal layer 50b is a multilayer stack of a first metal film 510 (such as a titanium film) formed by dry plating (such as sputtering) and a second metal film 520 (such as a copper film) formed on the first metal film 510 by wet plating (such as electroplating). The metal layer 70b is a multilayer stack of a third metal film (such as a titanium film) formed by dry plating (such as sputtering) and a fourth metal film (such as a copper film) formed on the third metal film by wet plating (such as electroplating).

Figure 11B:
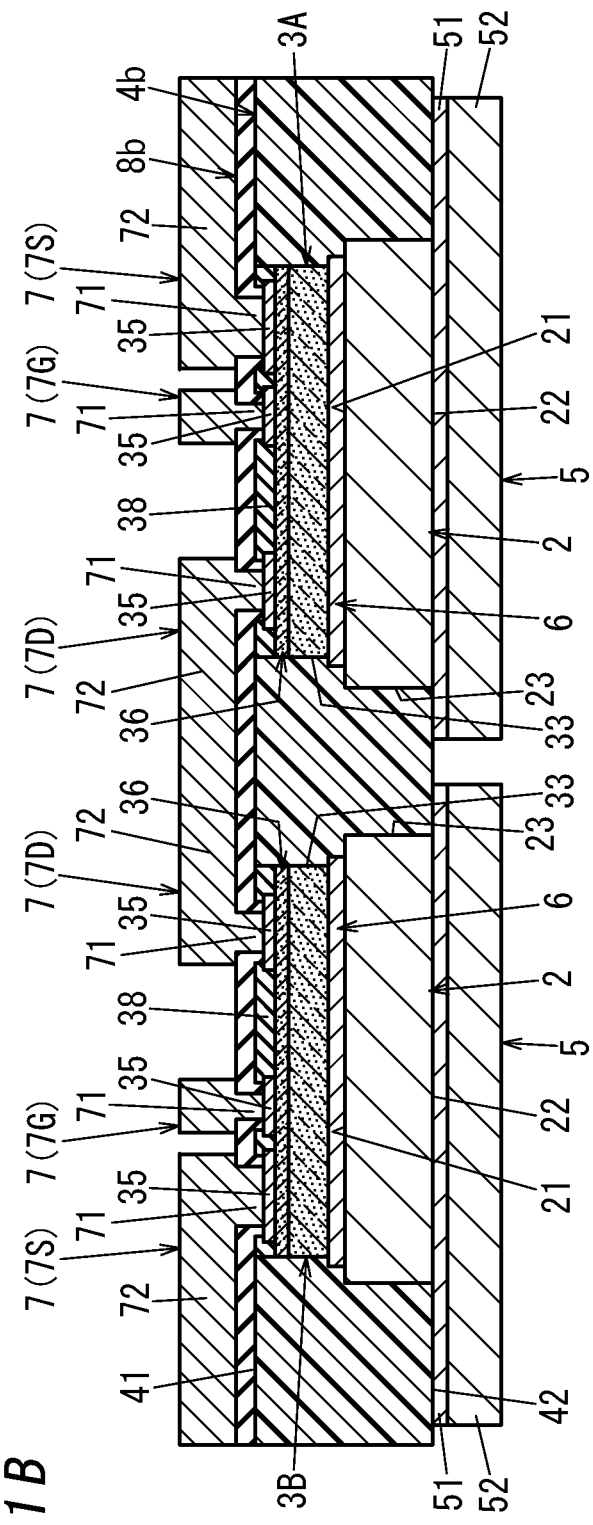

In the eighth process step, the metal layer 50b is patterned by, for example, photolithography and etching techniques to form two heat-dissipating metal layers 5, and the metal layer 70b is patterned by, for example, photolithography and etching techniques to form the plurality of conductor layers 7 for each of the semiconductor chips 3A and 3B (see FIG. 11B).

In the ninth process step, a third electrical insulating layer 9 is formed out of a solder resist layer by, for example, photolithographic technique (see FIG. 12A).

If multiple pairs of semiconductor chips 3A and 3B, not just one pair of semiconductor chips 3A and 3B, are adhered onto the supporting sheet 11 in the second process step, a set of semiconductor devices 1b may be formed by performing the second through ninth process steps.

In that case, in the tenth process step, the set of semiconductor devices 1b is divided into respective semiconductor devices 1b with a dicing saw, for example, to obtain a plurality of semiconductor devices 1b (only one of which is shown in FIG. 12B).

In the method for fabricating the semiconductor device 1b, the fourth and fifth process steps may be performed in reverse order.

Figure 13:
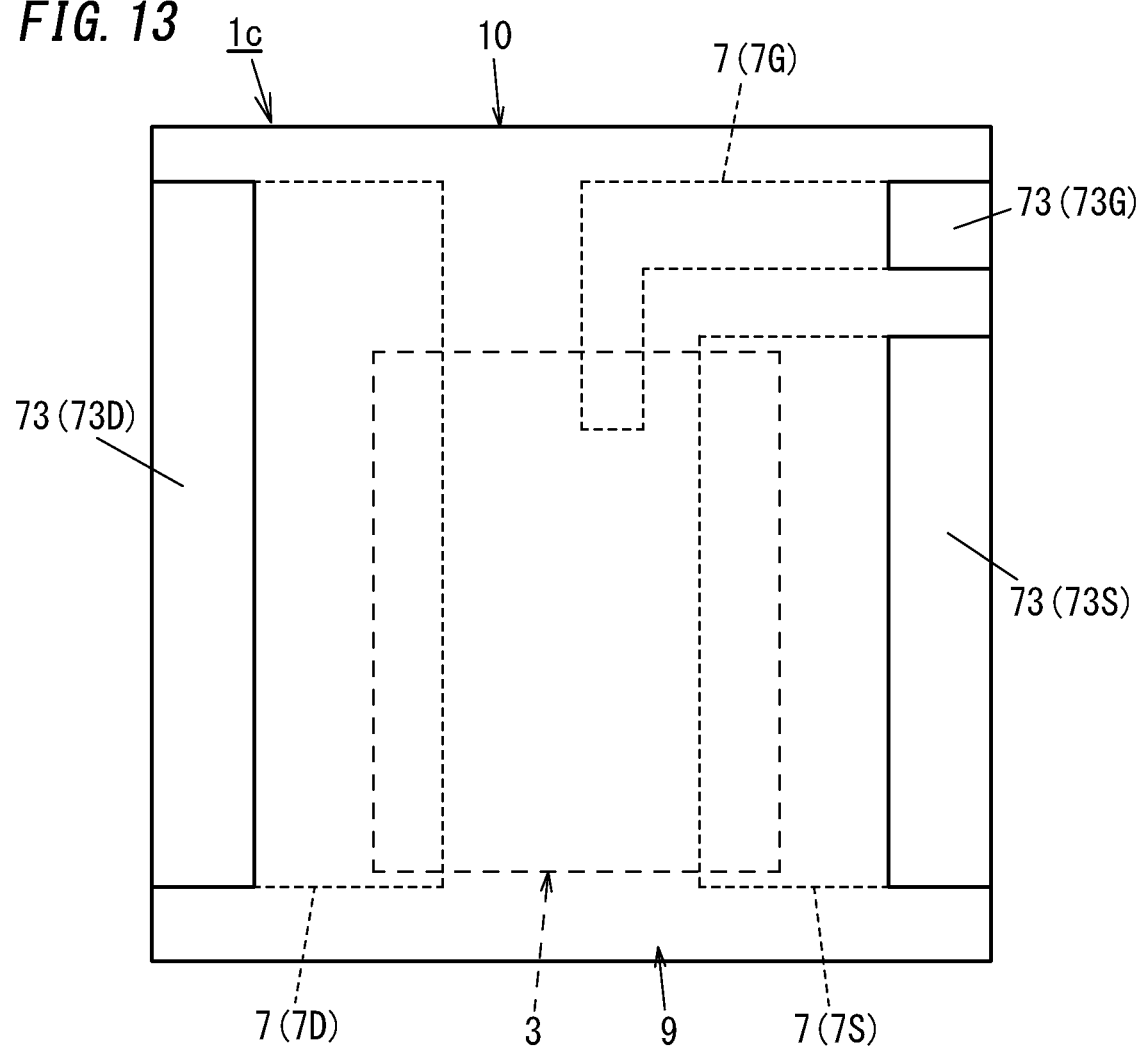
FIG. 13 is a bottom view of a semiconductor device according to a second variation of the exemplary embodiment of the present invention.

FIG. 13 is a bottom view of a semiconductor device 1c according to a second variation of the exemplary embodiment. In the following description, any constituent element of the semiconductor device 1c according to the second variation, having the same function as a counterpart of the semiconductor device 1 according to the exemplary embodiment described above, will be designated by the same reference numeral as that counterpart's, and description thereof will be omitted herein.

In the semiconductor device 1c according to the second variation, the third electrical insulating layer 9 has a different pattern from the third electrical insulating layer 9 of the semiconductor device 1 according to the exemplary embodiment. Specifically, in the semiconductor device according to the exemplary embodiment, the third electrical insulating layer 9 (see FIG. 3) is patterned such that each of the drain interconnect layer 7D and the source interconnect layer 7S has a plurality of terminal layers 73. On the other hand, in the semiconductor device 1c according to the second variation, the third electrical insulating layer 9 is patterned such that each of the drain interconnect layer 7D and the source interconnect layer 7S has a single terminal layer 73.

Figure 14:
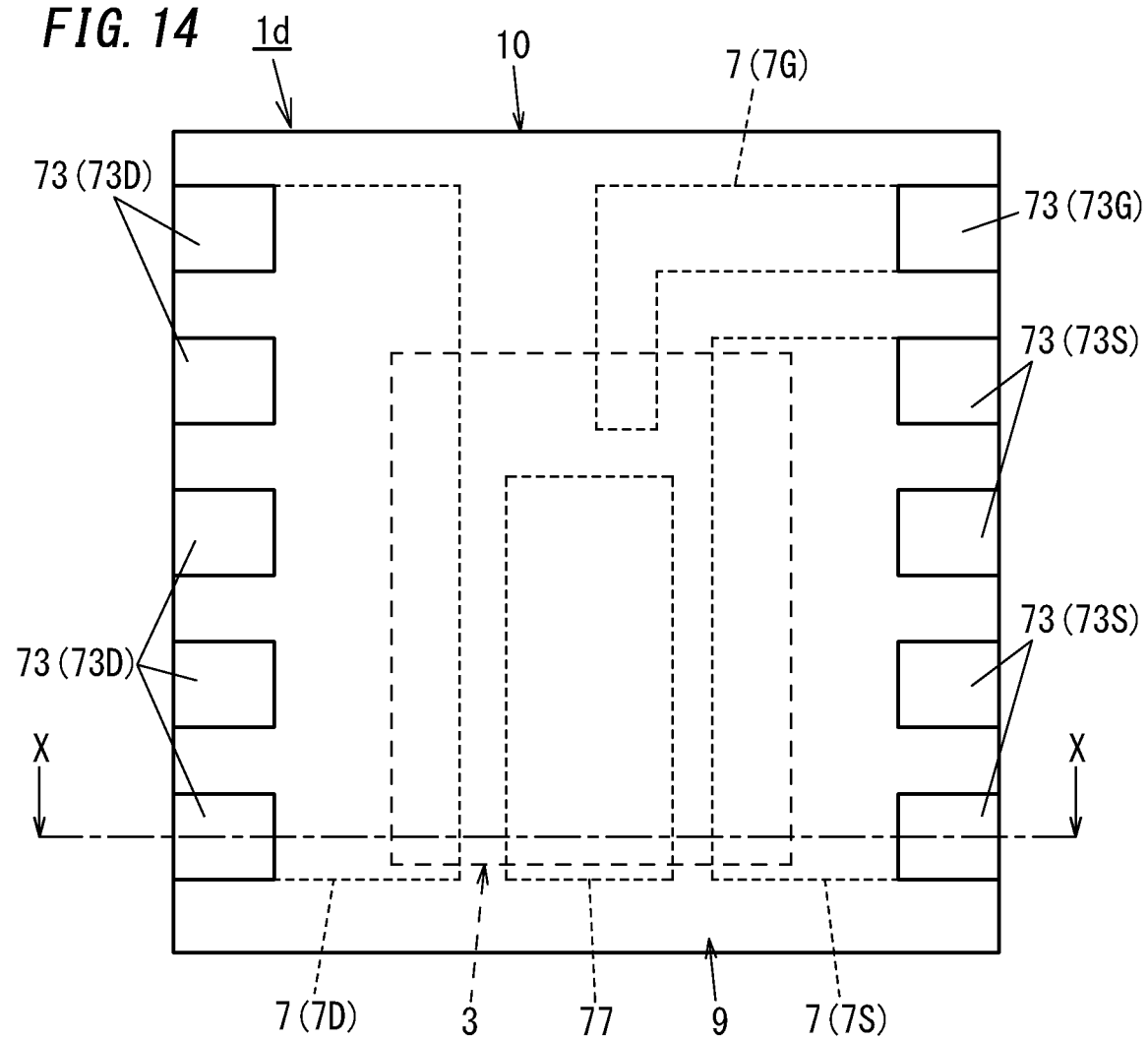
FIG. 14 is a bottom view of a semiconductor device according to a third variation of the exemplary embodiment of the present invention.
Figure 15:
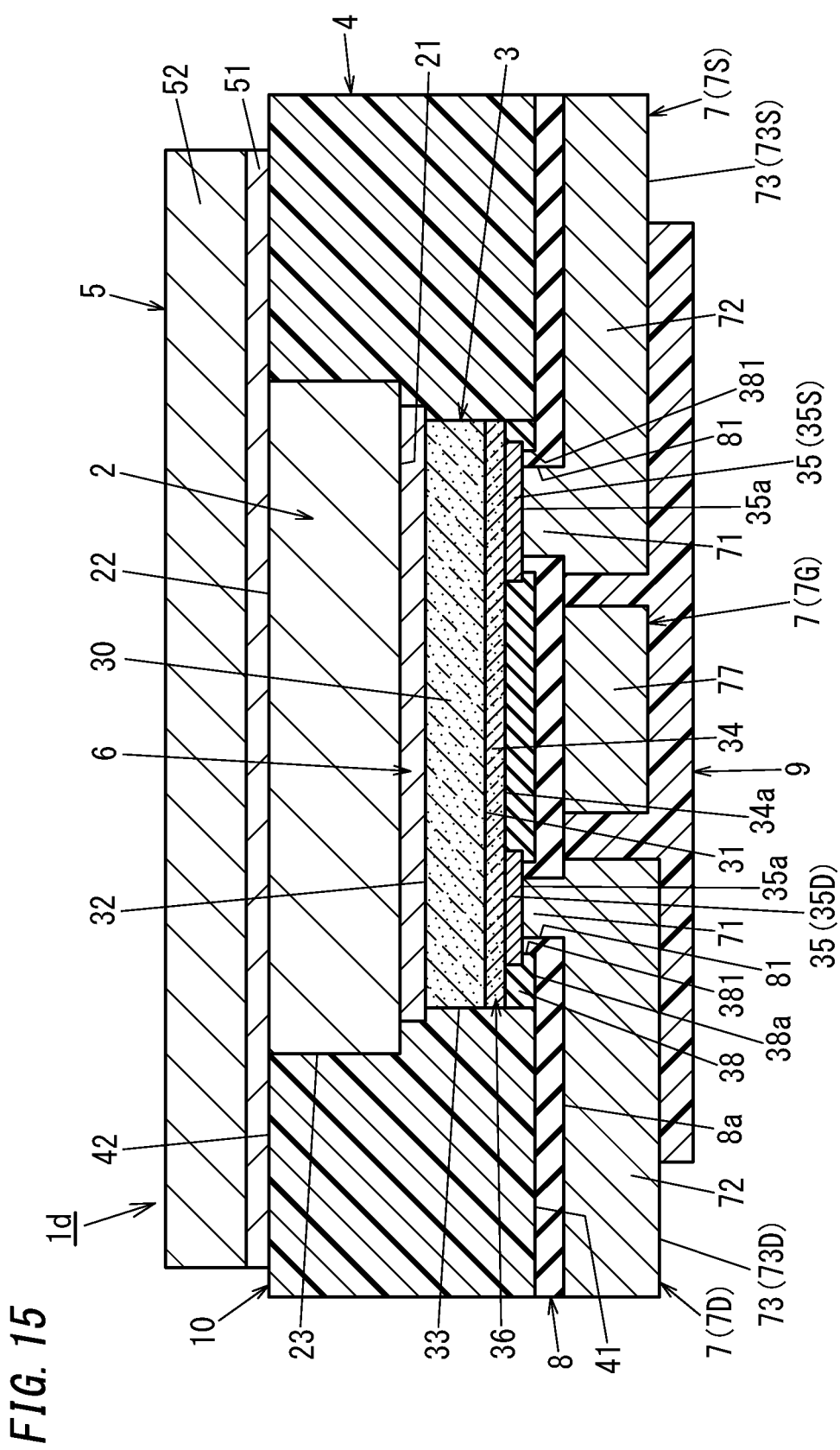
FIG. 15 is a cross-sectional view of the semiconductor device taken along the plane X-X shown in FIG. 14.

FIG. 14 is a bottom view of a semiconductor device 1d according to a third variation of the exemplary embodiment. FIG. 15 is a cross-sectional view thereof taken along the plane X-X shown in FIG. 14. In the following description, any constituent element of the semiconductor device 1d according to the third variation, having the same function as a counterpart of the semiconductor device 1 according to the exemplary embodiment described above, will be designated by the same reference numeral as that counterpart's, and description thereof will be omitted herein.

The semiconductor device 1d according to the third variation further includes, besides a first heat-dissipating metal layer 5 that is the heat-dissipating metal layer 5 of the semiconductor device 1 according to the exemplary embodiment (see FIGS. 1 and 2), a second heat-dissipating metal layer 77, which is a major difference from the semiconductor device 1 according to the exemplary embodiment.

The second heat-dissipating metal layer 77 is formed on the second electrical insulating layer 8 to overlap with a part of the semiconductor chip 3 along the thickness of the semiconductor chip 3. The second heat-dissipating metal layer 77 is out of contact with the plurality of conductor layers 7. In this variation, the pattern for the second heat-dissipating metal layer 77 is designed so as to ensure a predetermined electrical insulation distance from each of the plurality of conductor layers 7. That is to say, the second heat-dissipating metal layer 77 is electrically insulated from the semiconductor chip 3 and the plurality of conductor layers 7. The second heat-dissipating metal layer 77 is formed to avoid the gate interconnect layer 7G between the source interconnect layer 7S and the drain interconnect layer 7D. The second heat-dissipating metal layer 77, as well as the plurality of conductor layers 7, is implemented as a multilayer stack of a titanium film and a copper film.

The method for fabricating the semiconductor device 1d according to the third variation is substantially the same as the method for fabricating the semiconductor device 1 according to the exemplary embodiment. The only difference between these two methods is that in the process step of forming a plurality of conductor layers 7, the second heat-dissipating metal layer 77 is formed simultaneously with the plurality of conductor layers 7.

The second heat-dissipating metal layer 77 is covered with the third electrical insulating layer 9. However, this is only an example and should not be construed as limiting. Alternatively, the second heat-dissipating metal layer 77 may be exposed at least partially without being covered with the third electrical insulating layer 9.

Figure 16:
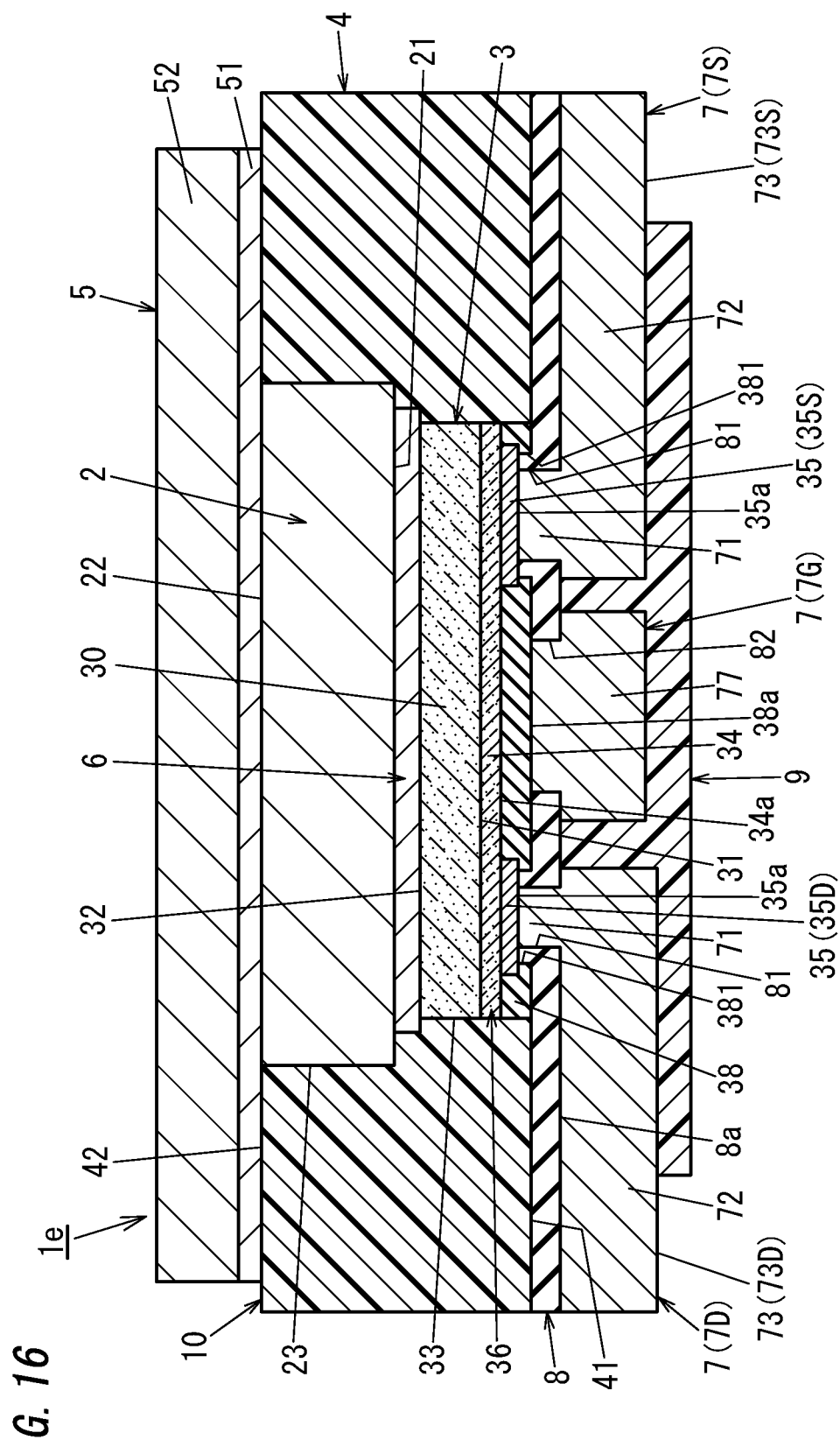
FIG. 16 is a cross-sectional view of a semiconductor device according to a fourth variation of the exemplary embodiment of the present invention.

FIG. 16 is a cross-sectional view of a semiconductor device 1e according to a fourth variation of the exemplary embodiment. In the following description, any constituent element of the semiconductor device 1e according to the fourth variation, having the same function as a counterpart of the semiconductor device 1d according to the third variation described above, will be designated by the same reference numeral as that counterpart's, and description thereof will be omitted herein.

In the semiconductor device 1e according to the fourth variation, the second electrical insulating layer 8 has a through hole 82, in which a portion of the second heat-dissipating metal layer 77 is arranged. The second heat-dissipating metal layer 77 is formed over the surface 38a of the first electrical insulating layer 38 and the surface 8a of the second electrical insulating layer 8. The semiconductor device 1e according to the fourth variation is able to reduce the thermal resistance between the second heat-dissipating metal layer 77 and the semiconductor chip 3, compared to the semiconductor device 1d according to the third variation.

The method for fabricating the semiconductor device 1e according to the fourth variation is substantially the same as the method for fabricating the semiconductor device 1 according to the exemplary embodiment. Their differences lie in that in the process step of forming the second electrical insulating layer 8 out of a polyimide film by photolithographic technique, for example, the through hole 82 and the second hole 81 are formed simultaneously and that in the process step of forming a plurality of conductor layers 7, the second heat-dissipating metal layer 77 and the plurality of conductor layers 7 are formed simultaneously.

Note that these first to fourth variations are not the only variations of the exemplary embodiment and should not be construed as limiting. Rather the exemplary embodiment may also be modified in various other ways depending on a design choice or any other factor without departing from a scope of the present invention.

For example, the substrate 30 of the semiconductor chip 3 does not have to be a silicon substrate but may also be a GaN substrate, an SiC substrate, or a sapphire substrate as well.

The transistor 36 of the semiconductor chip 3 does not have to be a normally off-mode lateral transistor but may also be a normally on-mode lateral transistor as well.

In the exemplary embodiment described above, each of the plurality of electrodes 35 of the semiconductor chip 3 is an ohmic electrode. However, this is only an example and should not be construed as limiting. Alternatively, the electrode 35 may include an ohmic electrode and a pad electrode formed on the ohmic electrode as well.

Optionally, the transistor 36 may include not only the semiconductor layer 34 and the plurality of electrodes 35 but also the substrate 30 as well.

Furthermore, the transistor 36 does not have to be a GaN-based HEMT, but may also be an SiC-based HEMT, a GaAs-based HEMT, a power MOSFET, or an IGBT as well.

Furthermore, the functional device included in the semiconductor chip 3 does not have to be the transistor 36 but may also be a diode, an integrated circuit, or any other suitable device or circuit.

Furthermore, the supporting substrate 2 does not have to be a ceramic substrate but may also be a copper substrate, for example. In this case, to reduce the chances of doing damage to the semiconductor chip 3 due to its warp caused by the difference in linear expansion coefficient between the substrate 30 and the supporting substrate 2, the material for the supporting substrate 2 is suitably a material, of which the linear expansion coefficient is not significantly different from that of the material for the substrate 30 of the semiconductor chip 3. The linear expansion coefficients of silicon, aluminum nitride, alumina, and copper are $2.6 \times 10^{-6}$/K, $4.6 \times 10^{-6}$/K, $7.1 \times 10^{-6}$/K, and $16.6 \times 10^{-6}$/K, respectively.

When a copper substrate is adopted as the supporting substrate 2, the supporting substrate 2 suitably has as small planar dimensions and as great thickness as possible, in order to reduce the warp of the semiconductor chip 3. In this case, to conduct the heat generated by the semiconductor chip 3 to the heat-dissipating metal layer 5 as efficiently as possible, the planar dimensions of the supporting substrate 2 are suitably larger than those of the semiconductor chip 3. Also, when a copper substrate is adopted as the supporting substrate 2, the supporting substrate 2 suitably has a thickness of 500 μm or more to reduce the warp of the semiconductor chip 3. In the semiconductor device 1, when the substrate 30 of the semiconductor chip 3 is a silicon substrate and the supporting substrate 2 is a copper substrate, the substrate 30 and the supporting substrate 2 are electrically connected together by being bonded together with a bonding portion 6 with electrical conductivity.

Meanwhile, when the substrate 30 is a conductive substrate and the supporting substrate 2 is a ceramic substrate, the semiconductor devices 1, 1b, 1c, 1d, and 1e may be provided with a via running through the thickness of the ceramic substrate and electrically connected to the substrate 30.

Optionally, the heat-dissipating metal layer 5 may cover the second surface 22 of the supporting substrate 2 and the second surface 42 of the resin member 4 entirely.

Furthermore, as long as the second electrical insulating layer 8 covers the boundary between the surface 38a of the first electrical insulating layer 38 and the first surface 41 of the resin member 4, the second electrical insulating layer 8 may cover the surface 38a of the first electrical insulating layer 38 and the first surface 41 of the resin member 4 at least partially.

The semiconductor device 1b according to the first variation is implemented as a bidirectional switch with a common drain, in which the respective drain electrodes 35D of the two transistors 36 are electrically connected together. However, this is only an example and should not be construed as limiting. Alternatively, the semiconductor device 1b according to the first variation may also be a bidirectional switch with a common source in which the respective source electrodes 35S of the two transistors 36 are electrically connected together.

(Resume)

The following aspects are disclosed from the exemplary embodiment and its variations described above.

A semiconductor device (1, 1b, 1c, 1d, 1e) according to a first aspect includes a supporting substrate (2), a semiconductor chip (3, 3A, 3B), a resin member (4, 4b), and a heat-dissipating metal layer (5). The supporting substrate (2) has a first surface (21) and a second surface (22) that are located opposite from each other in a thickness direction defined for the supporting substrate (2). The semiconductor chip (3, 3A, 3B) includes a plurality of electrodes (35). The semiconductor chip (3, 3A, 3B) is bonded to the supporting substrate (2) on one side thereof with the first surface (21). The resin member (4, 4b) has a first surface (41) and a second surface (42) that are located opposite from each other in a thickness direction defined for the resin member (4, 4b). The resin member (4, 4b) covers at least a side surface (23) of the supporting substrate (2) and a side surface (33) of the semiconductor chip (3, 3A, 3B). The heat-dissipating metal layer (5) is arranged in contact with the supporting substrate (2) and the resin member (4, 4b) to cover the second surface (22) of the supporting substrate (2) and the second surface (42) of the resin member (4, 4b) at least partially.

This configuration allows the semiconductor device (1, 1b, 1c, 1d, 1e) to have improved heat dissipation properties as well as a reduced overall size.

In a semiconductor device (1, 1b, 1c, 1d, 1e) according to a second aspect, which may be implemented in conjunction with the first aspect, the heat-dissipating metal layer (5) includes a first metal layer (51) and a second metal layer (52). The first metal layer (51) is arranged in contact with the second surface (22) of the supporting substrate (2) and the second surface (42) of the resin member (4, 4b). The second metal layer (52) is arranged opposite from the supporting substrate (2) and the resin member (4, 4b) with respect to the first metal layer (51). The second metal layer (52) has a greater thickness, and a higher thermal conductivity than, the first metal layer (51). This allows the semiconductor device (1, 1b, 1c, 1d, 1e) to have improved heat dissipation properties while increasing the degree of close contact between the heat-dissipating metal layer (5), the supporting substrate (2), and the resin member (4, 4b).

In a semiconductor device (1, 1b, 1c, 1d, 1e) according to a third aspect, which may be implemented in conjunction with the second aspect, metallic grains of the first metal layer (51) have a smaller average grain size than metallic grains of the second metal layer (52). This allows the semiconductor device (1, 1b, 1c, 1d, 1e) to increase the degree of close contact between the heat-dissipating metal layer (5), the supporting substrate (2), and the resin member (4, 4b).

In a semiconductor device (1, 1b, 1c, 1d, 1e) according to a fourth aspect, which may be implemented in conjunction with any one of the first to third aspects, the semiconductor chip (3, 3A, 3B) includes a substrate (30), a semiconductor layer (34), the plurality of electrodes (35), and an electrical insulating layer (38). The substrate (30) has a principal surface (31) and a back surface (32) that are located opposite from each other in a thickness direction defined for the substrate (30). The semiconductor layer (34) is arranged on the principal surface (31) of the substrate (30). The plurality of electrodes (35) are arranged on one surface (34a), opposite from the substrate (30), of the semiconductor layer (34). The electrical insulating layer (38) is arranged on the surface (34a) of the semiconductor layer (34). The electrical insulating layer (38) has a plurality of holes (381) that respectively expose the plurality of electrodes (35). The semiconductor device (1, 1b, 1c, 1d, 1e) further includes a plurality of conductor layers (7). The plurality of conductor layers (7) are formed along respective surfaces of the plurality of electrodes (35) of the semiconductor chip (3, 3A, 3B), a surface (38a) of the electrical insulating layer (38) of the semiconductor chip (3, 3A, 3B), and the first surface (41) of the resin member (4, 4b). This allows the semiconductor device (1, 1b, 1c, 1d, 1e) to reduce inductance components and improve its heat dissipation properties, compared to a situation where the conductor layers (7) are replaced with bonding wires.

In a semiconductor device (1, 1b, 1c, 1d, 1e) according to a fifth aspect, which may be implemented in conjunction with the fourth aspect, each of the plurality of conductor layers (7) includes a first interconnect layer (71) and a second interconnect layer (72). The first interconnect layer (71) is arranged in contact with an associated one of the plurality of electrodes (35) and located inside of a corresponding one of the plurality of holes (381). The second interconnect layer (72) is formed along the surface (38a) of the electrical insulating layer (38) and the first surface (41) of the resin member (4, 4b). This allows the semiconductor device (1, 1b, 1c, 1d, 1e) to make the line width of the second interconnect layer (72) broader than that of the first interconnect layer (71), thus improving the heat dissipation properties thereof.

In a semiconductor device (1, 1b, 1c, 1d, 1e) according to a sixth aspect, which may be implemented in conjunction with the fifth aspect, at least one conductor layer (7), out of the plurality of conductor layers (7), includes a terminal layer (73) arranged opposite from the first interconnect layer (71) with respect to the second interconnect layer (72). The terminal layer (73) is formed along the first surface (41) of the resin member (4, 4b). This allows the semiconductor device (1, 1b, 1c, 1d, 1e) to electrically connect the terminal layer (73) to a conductor portion of a circuit board such as a printed wiring board with either solder or bonding wires.

In a semiconductor device (1, 1b, 1c, 1d, 1e) according to a seventh aspect, which may be implemented in conjunction with the sixth aspect, the electrical insulating layer (38) is an organic film. The semiconductor device (1, 1b, 1c, 1d, 1e) further includes, besides a first electrical insulating layer (38) serving as the electrical insulating layer (38), a second electrical insulating layer (8, 8b). The second electrical insulating layer (8, 8b) covers at least a part of the surface (38a) of the first electrical insulating layer (38) and at least a part of the first surface (41) of the resin member (4, 4b). The second electrical insulating layer (8, 8b) covers a boundary between the surface (38a) of the first electrical insulating layer (38) and the first surface (41) of the resin member (4, 4b). The second interconnect layer (72) and the terminal layer (73) are formed on the second electrical insulating layer (8, 8b). This allows the semiconductor device (1, 1b, 1c, 1d, 1e) to have improved electrical insulation properties and humidity resistance, thus eventually increasing its degree of reliability.

A semiconductor device (1d, 1e) according to an eighth aspect, which may be implemented in conjunction with the seventh aspect, further includes, besides a first heat-dissipating metal layer (5) serving as the heat-dissipating metal layer (5), a second heat-dissipating metal layer (77). The second heat-dissipating metal layer (77) is formed on the second electrical insulating layer (8, 8b) so as to overlap with a part of the semiconductor chip (3, 3A, 3B) in a thickness direction defined for the semiconductor chip (3, 3A, 3B) and is out of contact with the plurality of conductor layers (7). This allows the semiconductor device (1d, 1e) to have further improved heat dissipation properties.

In a semiconductor device (1e) according to a ninth aspect, which may be implemented in conjunction with the eighth aspect, the second electrical insulating layer (8, 8b) has a through hole (82), in which a portion of the second heat-dissipating metal layer (77) is arranged. The second heat-dissipating metal layer (77) is formed over the surface (38a) of the first electrical insulating layer (38) and the surface (8a, 8ba) of the second electrical insulating layer (8, 8b). This allows the semiconductor device (1e) to have further improved heat dissipation properties.

In a semiconductor device (1, 1b, 1c, 1d, 1e) according to a tenth aspect, which may be implemented in conjunction with any one of the first to ninth aspects, the semiconductor chip (3, 3A, 3B) includes a transistor (36). This allows the semiconductor device (1, 1b, 1c, 1d, 1e) to more efficiently dissipate the heat generated by the transistor (36).

In a semiconductor device (1, 1b, 1c, 1d, 1e) according to an eleventh aspect, which may be implemented in conjunction with the tenth aspect, the semiconductor chip (3, 3A, 3B) includes a substrate (30) and the transistor (36). The substrate (30) has a principal surface (31) and a back surface (32) that are located opposite from each other in a thickness direction defined for the substrate (30). The transistor (36) is a lateral transistor (36) including a semiconductor layer (34) and the plurality of electrodes (35). The semiconductor layer (34) is arranged on the principal surface (31) of the substrate (30). The plurality of electrodes (35) are arranged on one surface (34a), opposite from the substrate (30), of the semiconductor layer (34). This allows the semiconductor device (1, 1b, 1c, 1d, 1e) to more efficiently dissipate the heat generated by a lateral transistor serving as the transistor (36).

A method for fabricating a semiconductor device (1, 1b, 1c, 1d, 1e) according to a twelfth aspect is designed to fabricate the semiconductor device (1, 1b, 1c, 1d, 1e) according to any one of the first to eleventh aspects. The method includes: forming, by plating, a metal layer (50, 50b) as a prototype of the heat-dissipating metal layer (5) in contact with the second surface (22) of the supporting substrate (2) and the second surface (42) of the resin member (4, 4b); and then patterning the metal layer (50, 50b) to form the heat-dissipating metal layer (5) out of a part of the metal layer (50, 50b). This allows a semiconductor device (1, 1b, 1c, 1d, 1e) with improved heat dissipation properties as well as a reduced overall size to be provided by this method for fabricating a semiconductor device (1, 1b, 1c, 1d, 1e).

A method for fabricating a semiconductor device (1, 1b, 1c, 1d, 1e) according to a thirteenth aspect is designed to fabricate the semiconductor device (1, 1b, 1c, 1d, 1e) according to the second or third aspect. The method includes: forming, by dry plating, a first metal film (510) as a prototype of the first metal layer (51) in contact with the second surface (22) of the supporting substrate (2) and the second surface (42) of the resin member (4, 4b); forming, by wet plating, a second metal film (520) as a prototype of the second metal layer (52) on the first metal film (510) after having formed the first metal film (510) such that the second metal film (520) is arranged opposite from the supporting substrate (2) and the resin member (4, 4b) with respect to the first metal film (510); and then patterning a metal layer (50, 50b) as a multilayer stack including the first metal film (510) and the second metal film (520) to form the heat-dissipating metal layer (5) out of a part of the metal layer (50, 50b). This allows a semiconductor device (1, 1b, 1c, 1d, 1e) with improved heat dissipation properties as well as a reduced overall size to be provided by this method for fabricating a semiconductor device (1, 1b, 1c, 1d, 1e).

A method for fabricating a semiconductor device (1, 1b, 1c, 1d, 1e) according to a fourteenth aspect is designed to fabricate the semiconductor device (1, 1b, 1c, 1d, 1e) according to the fourth aspect. The method includes: bonding the semiconductor chip (3, 3A, 3B) and the supporting substrate (2) together; forming, after having bonded the semiconductor chip (3, 3A, 3B) and the supporting substrate (2), a resin layer (40, 40b) as a prototype of the resin member (4, 4b) so as to cover the side surface (23) of the supporting substrate (2), the side surface (33) of the semiconductor chip (3, 3A, 3B), and the second surface (22) of the supporting substrate (2); polishing, after having formed the resin layer (40, 40b), the resin layer (40, 40b) to the point of exposing the second surface (22) of the supporting substrate (2) to form the resin member (4, 4b) out of a part of the resin layer (40, 40b); and then forming, by plating, the heat-dissipating metal layer (5) and the plurality of conductor layers (7). This allows a semiconductor device (1, 1b, 1c, 1d, 1e) with improved heat dissipation properties as well as a reduced overall size to be provided by this method for fabricating a semiconductor device (1, 1b, 1c, 1d, 1e).

REFERENCE SIGNS LIST 1, 1b, 1c, 1d, 1e Semiconductor Device
2 Supporting Substrate
21 First Surface
22 Second Surface
23 Side Surface
3, 3A, 3B Semiconductor Chip
30 Substrate
31 Principal Surface
32 Back Surface
33 Side Surface
34 Semiconductor Layer
34a Surface
35 Electrode
35a Surface
36 Transistor
38 Electrical Insulating Layer (First Electrical Insulating Layer)
38a Surface
381 Hole
4, 4b Resin Member
40, 40b Resin Layer
41 First Surface
42 Second Surface
5 Heat-Dissipating Metal Layer (First Heat-Dissipating Metal Layer)
50, 50b Metal Layer
51 First Metal Layer
510 First Metal Film
52 Second Metal Layer
520 Second Metal Film
6 Bonding Portion
7 Conductor Layer
71 First Interconnect Layer
72 Second Interconnect Layer
73 Terminal Layer
77 Second Heat-Dissipating Metal Layer
8, 8b Second Electrical Insulating Layer
8a, 8ba Surface
82 Through Hole
9 Third Electrical Insulating Layer

The invention claimed is:

1. A semiconductor device comprising:
a supporting substrate having a first surface and a second surface that are located opposite from each other in a thickness direction defined for the supporting substrate;
a semiconductor chip including a plurality of electrodes and bonded to the supporting substrate on one side thereof with the first surface;
a bonding portion that bonds the semiconductor chip and the supporting substrate together;
a resin member having a first surface and a second surface that are located opposite from each other in a thickness direction defined for the resin member and covering at least a side surface of the supporting substrate and a side surface of the semiconductor chip; and
a heat-dissipating metal layer arranged in contact with the supporting substrate and the resin member to cover the second surface of the supporting substrate and the second surface of the resin member at least partially,
wherein planar dimensions of the supporting substrate are larger than planar dimensions of the semiconductor chip, and
the heat-dissipating metal layer includes:
a first metal layer arranged in contact with the second surface of the supporting substrate and the second surface of the resin member; and
a second metal layer arranged opposite from the supporting substrate and the resin member with respect to the first metal layer and having a greater thickness, and a higher thermal conductivity, than the first metal layer.

2. The semiconductor device of claim 1, wherein
metallic grains of the first metal layer have a smaller average grain size than metallic grains of the second metal layer.

3. The semiconductor device of claim 1, wherein
the semiconductor chip includes:
a substrate having a principal surface and a back surface that are located opposite from each other in a thickness direction defined for the substrate;
a semiconductor layer arranged on the principal surface of the substrate;
the plurality of electrodes arranged on one surface, opposite from the substrate, of the semiconductor layer; and an electrical insulating layer arranged on the surface of the semiconductor layer and having a plurality of holes that respectively expose the plurality of electrodes, and wherein the semiconductor device further includes a plurality of conductor layers formed along respective surfaces of the plurality of electrodes of the semiconductor chip, a surface of the electrical insulating layer of the semiconductor chip, and the first surface of the resin member.

4. The semiconductor device of claim 3, wherein
each of the plurality of conductor layers includes:
a first interconnect layer arranged in contact with an associated one of the plurality of electrodes and located inside of a corresponding one of the plurality of holes; and
a second interconnect layer formed along the surface of the electrical insulating layer and the first surface of the resin member.

5. The semiconductor device of claim 4, wherein
at least one conductor layer, out of the plurality of conductor layers, includes a terminal layer arranged opposite from the first interconnect layer with respect to the second interconnect layer,
the terminal layer being formed along the first surface of the resin member.

6. The semiconductor device of claim 5, wherein
the electrical insulating layer is an organic film,
the semiconductor device further includes, besides a first electrical insulating layer serving as the electrical insulating layer, a second electrical insulating layer covering at least a part of the surface of the first electrical insulating layer and at least a part of the first surface of the resin member,
the second electrical insulating layer covers a boundary between the surface of the first electrical insulating layer and the first surface of the resin member, and
the second interconnect layer and the terminal layer are formed on the second electrical insulating layer.

7. The semiconductor device of claim 6, further comprising, besides a first heat-dissipating metal layer serving as the heat-dissipating metal layer, a second heat-dissipating metal layer,
the second heat-dissipating metal layer being formed on the second electrical insulating layer so as to overlap with a part of the semiconductor chip in a thickness direction defined for the semiconductor chip and being out of contact with the plurality of conductor layers.

8. The semiconductor device of claim 7, wherein
the second electrical insulating layer has a through hole, in which a portion of the second heat-dissipating metal layer is arranged, and
the second heat-dissipating metal layer is formed over the surface of the first electrical insulating layer and a surface of the second electrical insulating layer.

9. The semiconductor device of claim 1, wherein
the semiconductor chip includes a transistor.

10. The semiconductor device of claim 9, wherein
the semiconductor chip includes: a substrate having a principal surface and a back surface that are located opposite from each other in a thickness direction defined for the substrate; and the transistor, and
the transistor is a lateral transistor including: a semiconductor layer arranged on the principal surface of the substrate; and the plurality of electrodes arranged on one surface, opposite from the substrate, of the semiconductor layer.

11. A method for fabricating the semiconductor device of claim 1, the method comprising:
forming, by plating, a metal layer as a prototype of the heat-dissipating metal layer in contact with the second surface of the supporting substrate and the second surface of the resin member; and then
patterning the metal layer to form the heat-dissipating metal layer out of a part of the metal layer.

12. A method for fabricating the semiconductor device of claim 1, the method comprising:
forming, by dry plating, a first metal film as a prototype of the first metal layer in contact with the second surface of the supporting substrate and the second surface of the resin member;
forming, by wet plating, a second metal film as a prototype of the second metal layer on the first metal film after having formed the first metal film such that the second metal film is arranged opposite from the supporting substrate and the resin member with respect to the first metal film; and then
patterning a metal layer as a multilayer stack including the first metal film and the second metal film to form the heat-dissipating metal layer out of a part of the metal layer.

13. A method for fabricating the semiconductor device of claim 3, the method comprising:
bonding the semiconductor chip and the supporting substrate together;
forming, after having bonded the semiconductor chip and the supporting substrate, a resin layer as a prototype of the resin member so as to cover the side surface of the supporting substrate, the side surface of the semiconductor chip, and the second surface of the supporting substrate;
polishing, after having formed the resin layer, the resin layer to the point of exposing the second surface of the supporting substrate to form the resin member out of a part of the resin layer; and then
forming, by plating, the heat-dissipating metal layer and the plurality of conductor layers.

14. The semiconductor device of claim 1, wherein
the semiconductor chip includes:
a substrate having a principal surface and a back surface that are located opposite from each other in a thickness direction defined for the substrate;
a semiconductor layer arranged on the principal surface of the substrate;
the plurality of electrodes arranged on one surface, opposite from the substrate, of the semiconductor layer; and
an electrical insulating layer arranged on the surface of the semiconductor layer and having a plurality of holes that respectively expose the plurality of electrodes, and
wherein the semiconductor device further includes a plurality of conductor layers formed along respective surfaces of the plurality of electrodes of the semiconductor chip, a surface of the electrical insulating layer of the semiconductor chip, and the first surface of the resin member.

15. The semiconductor device of claim 2, wherein
the semiconductor chip includes:
a substrate having a principal surface and a back surface that are located opposite from each other in a thickness direction defined for the substrate;
a semiconductor layer arranged on the principal surface of the substrate;
the plurality of electrodes arranged on one surface, opposite from the substrate, of the semiconductor layer; and an electrical insulating layer arranged on the surface of the semiconductor layer and having a plurality of holes that respectively expose the plurality of electrodes, and wherein the semiconductor device further includes a plurality of conductor layers formed along respective surfaces of the plurality of electrodes of the semiconductor chip, a surface of the electrical insulating layer of the semiconductor chip, and the first surface of the resin member.

16. The semiconductor device of claim 14, wherein each of the plurality of conductor layers includes:

a first interconnect layer arranged in contact with an associated one of the plurality of electrodes and located inside of a corresponding one of the plurality of holes; and a second interconnect layer formed along the surface of the electrical insulating layer and the first surface of the resin member.

17. The semiconductor device of claim 15, wherein each of the plurality of conductor layers includes:

a first interconnect layer arranged in contact with an associated one of the plurality of electrodes and located inside of a corresponding one of the plurality of holes; and a second interconnect layer formed along the surface of the electrical insulating layer and the first surface of the resin member.

18. The semiconductor device of claim 2, wherein the semiconductor chip includes a transistor.

\* \* \* \* \*